United States Patent [19]
Arao et al.

[11] Patent Number: 5,804,466
[45] Date of Patent: Sep. 8, 1998

[54] PROCESS FOR PRODUCTION OF ZINC OXIDE THIN FILM, AND PROCESS FOR PRODUCTION OF SEMICONDUCTOR DEVICE SUBSTRATE AND PROCESS FOR PRODUCTION OF PHOTOELECTRIC CONVERSION DEVICE USING THE SAME FILM

[75] Inventors: Kozo Arao; Katsumi Nakagawa, both of Nara; Takaharu Kondo, Tsuzuki-gun; Yukiko Iwasaki, Nara, all of Japan

[73] Assignee: Canon Kabushiki Kaisha, Japan

[21] Appl. No.: 811,288

[22] Filed: Mar. 4, 1997

[30] Foreign Application Priority Data

Mar. 6, 1996 [JP] Japan ................... 8-048868
Nov. 14, 1996 [JP] Japan ................... 8-302576

[51] Int. Cl.$^6$ .......................... H01L 31/00; H01L 21/00; B05D 1/36; C25D 9/08
[52] U.S. Cl. ........................ 438/95; 136/256; 438/98; 438/608; 438/609; 438/678; 427/204; 427/205; 205/124; 205/155; 205/316; 205/333
[58] Field of Search .................. 136/256; 438/95, 438/98, 608, 609, 678; 427/204, 205; 205/124, 152, 153, 155, 316, 320, 323, 333

[56] References Cited

FOREIGN PATENT DOCUMENTS 8217443  8/1996  Japan .

OTHER PUBLICATIONS

Pascu, et al., Salts for chemical zinc coating of aluminum and its alloys, Rev. Chim. (Bucharest), vol. 38 No. 8, pp. 689–692, 1987.

P–IA–15a–SiC/A–Si/ASiGe Multi–Bandgap Stacked Solar Cells With Bandgap Profiling, Sannomiya et al., Technical Digest of the International PVSEC–5, Kyoto, Japan, p. 387, 1990.

Electrolyte Optimization for Cathodic Growth of Zinc Oxide Films, M. Izaki et al., Electrochem. Soc., vol. 143, Mar. 1996, L53.

Primary Examiner—Cecilia J. Tsang
Assistant Examiner—Jennifer Harle
Attorney, Agent, or Firm—Fitzpatrick, Cella Harper & Scinto

[57] ABSTRACT

A process for stably producing a zinc oxide thin film by electrolysis with excellent adhesion to a substrate is described. In particular, a zinc oxide thin film suitably used as a light confining layer of a photoelectric conversion element is formed on a conductive substrate by applying a current between a conductive substrate immersed in an aqueous solution containing at least nitrate ions, zinc ions, and a carbohydrate, and an electrode immersed in the solution.

70 Claims, 8 Drawing Sheets

F I G. 2
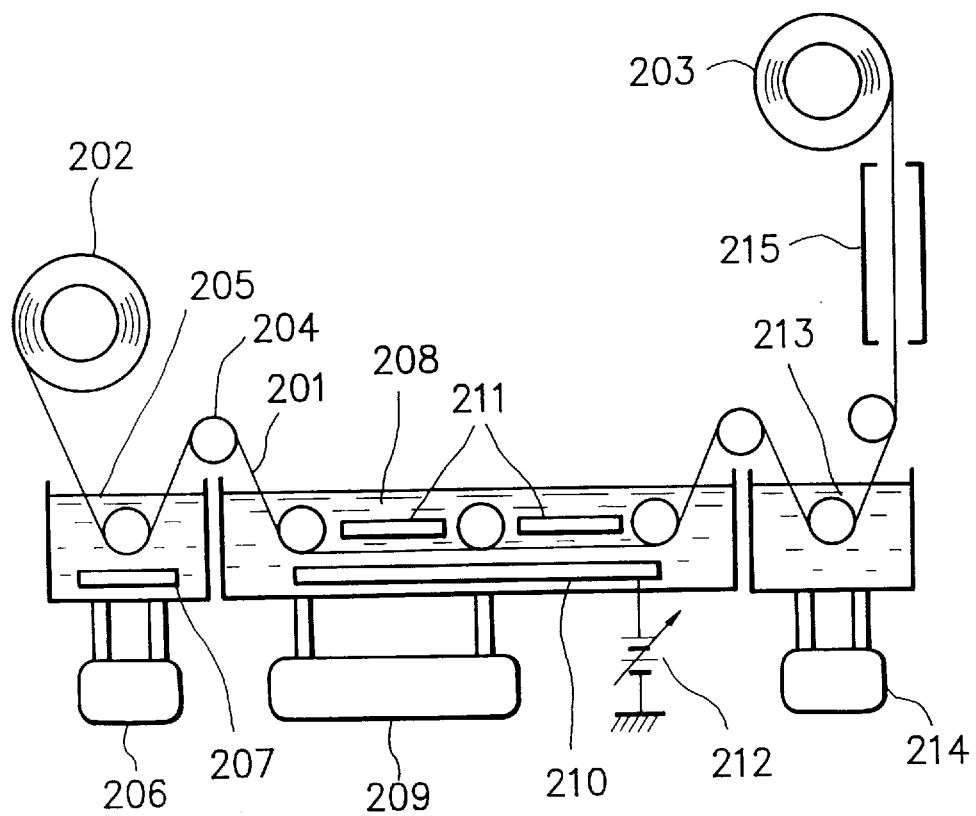

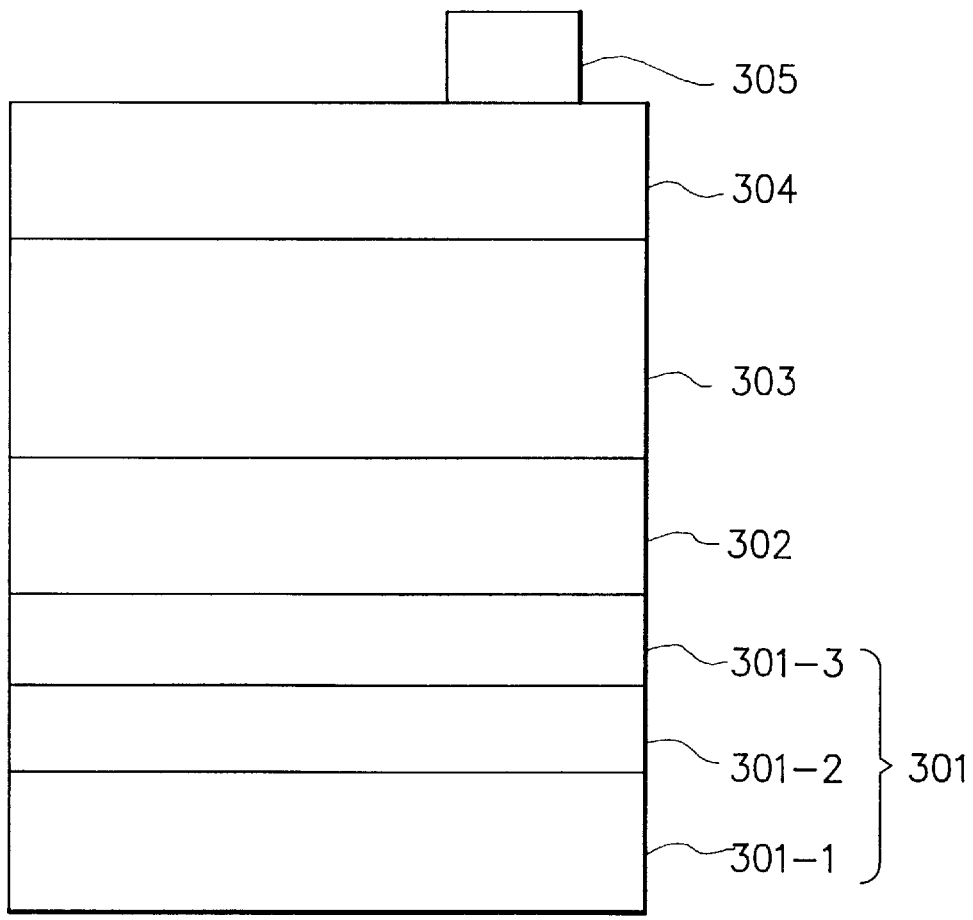
F I G. 3

PROCESS FOR PRODUCTION OF ZINC OXIDE THIN FILM, AND PROCESS FOR PRODUCTION OF SEMICONDUCTOR DEVICE SUBSTRATE AND PROCESS FOR PRODUCTION OF PHOTOELECTRIC CONVERSION DEVICE USING THE SAME FILM

BACKGROUND OF THE INVENTION

1. Field of the Invention

The present invention relates to a process for the production of a zinc oxide thin film by an electrolytic or electrochemical growth process, and a photoelectric conversion device using said film.

2. Related Background Art

In the field of photoelectric conversion devices, there is known a technique of providing a reflection layer on the back surface of a semiconductor layer to improve the efficiency of collecting rays of light in the long-wavelength region. Further, it is known that provision of a textured transparent conductive layer between a metal layer and a semiconductor layer confines rays of light therein by extending the optical path length of the rays of light reflected from the metal layer and also suppresses overcurrent from flowing at the time of shunt. Such a transparent conductive layer has been generally formed of a ZnO film by sputtering.

For example, it has been reported that the short-circuit current due to the light confining effect can be increased by combination of a reflection layer and a zinc oxide layer: "Light Confining Effect in a-SiGe Solar Cell on 29p-MF-22 Stainless Steel Substrate", Digest of the 51th Symposium of Japan Society of Applied Physics, p747, (Autumn, 1990) or "P-IA-15a-SiC/a-Si/a-SiGe Multi-Bandgap Stacked Solar Cells With Bandgap Profiling", Sannomiya et al., Technical Digest of the International PVSEC-5, Kyoto, Japan, p387, 1990.

Recently, processes for the production of a zinc oxide thin film by electrolysis using an aqueous solution containing zinc ions and nitrate ions have been reported, for example, in "Electrolyte Optimization for Cathodic Growth of Zinc Oxide Films", M. IZAKI and T. Omi, J. Electrochem. Soc., Vol. 143, March 1996, L53 and in Japanese Patent Laid-open No. Hei 8-217443.

The light confining layer described above, however, is generally formed by resistance heating vacuum deposition, electron beam vacuum deposition, sputtering, ion plating, or CVD, and consequently, there arise problems that the cost required for preparing a target material is high, a complicated vacuum process is unavoidably required for formation of the layer, the depreciation cost for a vacuum apparatus is high, and the material utilization efficiency is not high. This significantly increases the cost of photoelectric conversion devices including the light confining layers prepared by such a technique, leading to a large barrier to the industrial applications of solar cells.

The zinc oxide thin film formed by electrolysis using an aqueous solution containing zinc ions and nitrate ions is low in cost; however, the process for the formation of such a film has the following problems:

(1) Particularly, in the case where the current density is high and/or the concentration of the solution is also high, crystals of zinc oxide are liable to be abnormally grown in the acicular, spherical or dendritic shape having a size over the order of 1 $\mu$m during deposition of the film, and in the case of using the zinc oxide thin film containing such an abnormal growth portion of crystals as part of a photoelectric conversion device, the abnormal growth portion possibly induces the shunt pass of the photoelectric conversion device.

(2) The sizes of crystal grains of zinc oxide tend to be varied, to thereby cause a problem in uniformity in the case of forming the zinc oxide thin film having a large area.

(3) The adhesion property of the zinc oxide thin film to the substrate is inferior to that of the zinc oxide thin film formed by evaporation, electron beam deposition, sputtering, ion plating or CVD.

(4) Only a thin film having a smooth thickness can be formed, and textured surfaces effective for light confinement, have not been disclosed.

SUMMARY OF THE INVENTION

An object of the present invention is to provide a process for stably producing a zinc oxide thin film by electrolysis with excellent adhesion to a substrate.

Another object of the present invention is to provide a process for the production of a zinc oxide thin film suitably used as a light confining layer of a photoelectric conversion device.

To achieve the above object, according to the present invention, there is provided a process for the production of a zinc oxide thin film, comprising the step of applying a current between a conductive substrate immersed in an aqueous solution containing at least nitrate ions, zinc ions, and a carbohydrate, and an electrode immersed in the solution, thereby forming a zinc oxide thin film on said conductive substrate.

The concentration of each of the nitrate ions and zinc ions is preferably in a range from 0.001 mol/l to 1.0 mol/l, more preferably, in a range from 0.01 mol/l to 0.5 mol/l, most preferably, in a range from 0.1 mol/l to 0.25 mol/l.

The content of the carbohydrate in the aqueous solution is preferably in a range from 0.001 g/l to 300 g/l, more preferably, in a range from 0.005 g/l to 100 g/l, most preferably, in a range from 0.01 g/l to 60 g/l.

Why a zinc oxide thin film with excellent uniformity can be produced is not clear at the present time, but the nucleation of crystals possibly becomes uniform by interaction between the carbohydrate and zinc-base ions such as $Zn(OH)^+$ in the aqueous solution.

Why a zinc oxide film without abnormal growth of crystals can be produced is not clear at the present time, but the absorption of molecules of the carbohydrate on the substrate possibly functions to obstruct the development of abnormal growth of crystals.

Why a zinc oxide thin film excellent in adhesion with a substrate can be produced is not clear at the present time, but it may be considered that zinc-based ions absorbed on the substrate are diffused on the surface of the zinc oxide thin film and are entrapped in crystal lattices at appropriate positions, to densify the film, thereby producing the zinc oxide thin film with excellent adhesion to the substrate.

In addition, by heating the conductive substrate using a heating means before being immersed into the aqueous solution, the addition effects of the carbohydrate at the step of the initial film formation, which are important for the production of a crystalline thin film, become significant, thereby producing a high quality zinc oxide thin film. In this case, as the heating means for heating the conductive substrate, there can be used a lamp heater or a hot water tank provided separately from the film formation tank.

Of the addition effects of the carbohydrate, the uniformity enhancing effect can be particularly attributed to the zinc oxide thin film in the case of using a monosaccharide such as glucose (grape sugar) or fructose (fruit sugar) as the carbohydrate; the abnormal growth preventive effect can be particularly attributed to the zinc oxide thin film in the case of using a disaccharide such as maltose (malt sugar) or sucrose (cane sugar) as the carbohydrate; and the adhesion property enhancing effect can be particularly attributed to the zinc oxide thin film in the case of using a polysaccharide such as dextrin or starch as the carbohydrate. In addition, two or more of these effects can be given to the zinc oxide thin film in the case of using the above carbohydrates in combination.

In the process of the present invention, the use of a zinc electrode as the electrode immersed in the aqueous solution is effective to keep the composition of the aqueous solution such as the concentration of zinc ions and the pH constant. This makes it possible to produce a thin film substantially in the same condition for a long period of time without additionally supplying zinc ions in order to keep the composition of the electrolytic solution constant, and hence to form a zinc oxide thin film excellent in uniformity.

In the case where the aqueous solution is kept at a temperature more than 50° C., and/or in the case where the density of the current applied to the electrode is in a range of from 10 mA/dm² to 10 A/dm², it is possible to efficiently produce a zinc oxide thin film excellent in purity.

The reason for this is as follows. The deposition reaction of ZnO on the surface of the substrate may be considered to be related to intermediate substances such as nitrate ions $NO^{3-}$, nitrite ions $NO^{2-}$, ammonium ions $NH^{4+}$, hydroxide ions $OH^-$ and hydrated ions of zinc. From this viewpoint, in the case where the temperature of the aqueous solution is lower than 50° C. or in the case where the density of the current applied to the electrode is out of the above range, the reaction related to these intermediate substances possibly does not sufficiently proceed, and consequently, substances other than zinc oxide, for example, zinc would be precipitated, whereby making it difficult to produce a zinc oxide thin film having a high purity. Additionally, in the case where the current density is smaller than 10 mA/dm², it is difficult to obtain a sufficient reaction rate.

The substrate can be formed of a support provided with a metal layer made of a metal having a high reflectance. This makes it possible to enhance the reflectance of the substrate, and hence to produce a photoelectric conversion device having a higher photoelectric conversion efficiency.

The size and the orientation of crystal grains of a zinc oxide thin film can be varied by changing the temperature and the concentration of the aqueous solution, and the current density. Consequently, it is possible to produce a zinc oxide thin film having a higher adhesion property as well as a suitable textured surface by forming the zinc oxide thin films of a plurality of layers.

In particular, the concentration of ions and the current density are parameters closely related to the crystal growth of a zinc oxide thin film. In the case where the current density is small as compared with the concentration of metal ions, the degree of nucleation is reduced and thereby the crystal grains become larger. On the contrary, as the current density is increased, the crystal grains become smaller. If the concentration of metal ions is small and the current density is relatively high, the concentration polarization is generated by precipitation, with a result that crystal grains become fine because the concentration polarization accelerates the nucleation and obstructs the growth of crystal grains. As described above, the crystallized state of a zinc oxide thin film can be changed on the basis of these parameters of the aqueous solution.

From the viewpoint of the application to a photoelectric conversion device, the zinc oxide thin film is a stacked structure having a first zinc oxide layer made of fine crystal grains, having a smooth surface, and being excellent in adhering to the underlying layer; and a second zinc oxide layer made of large crystal grains, having a textured surface, and being excellent in light confining effect. Such a zinc oxide thin film can exhibit an excellent adhesion property to the substrate in combination with an excellent light confining effect.

The size of the first zinc oxide layer is preferably set at a value being one-tenth or less of that of the second zinc oxide layer. The crystal grains of the first zinc oxide layer are preferably grown with the C-axes thereof oriented perpendicularly to the substrate, and the crystal grains of the second zinc oxide layer are preferably grown with the <101> directions thereof oriented perpendicularly to the substrate.

The orientation of crystal grains can be controlled by the concentration of zinc nitrate. When the concentration of zinc nitrate is set at 0.1 mol/l, the crystal grains are grown with the c-axes thereof oriented obliquely to the substrate, that is, with the hexagonal planes thereof inclined to the substrate. On the other hand, when the concentration of zinc nitrate is set at 0.025 mol/l or less, the crystal grains are grown with the c-axes oriented perpendicularly to the substrate.

BRIEF DESCRIPTION OF THE DRAWINGS

FIG. 2 is a schematic view of an apparatus for the continuous production of a zinc oxide thin film according to the present invention;

FIG. 3 is a schematic view showing an example in which the zinc oxide thin film of the present invention is applied to a photoelectric conversion device;

DESCRIPTION OF THE PREFERRED
EMBODIMENTS OF THE PRESENT
INVENTION

Hereinafter, the preferred embodiments of the present invention will be described with reference to the accompanying drawings.

Process for production of zinc oxide film

Figure 1:
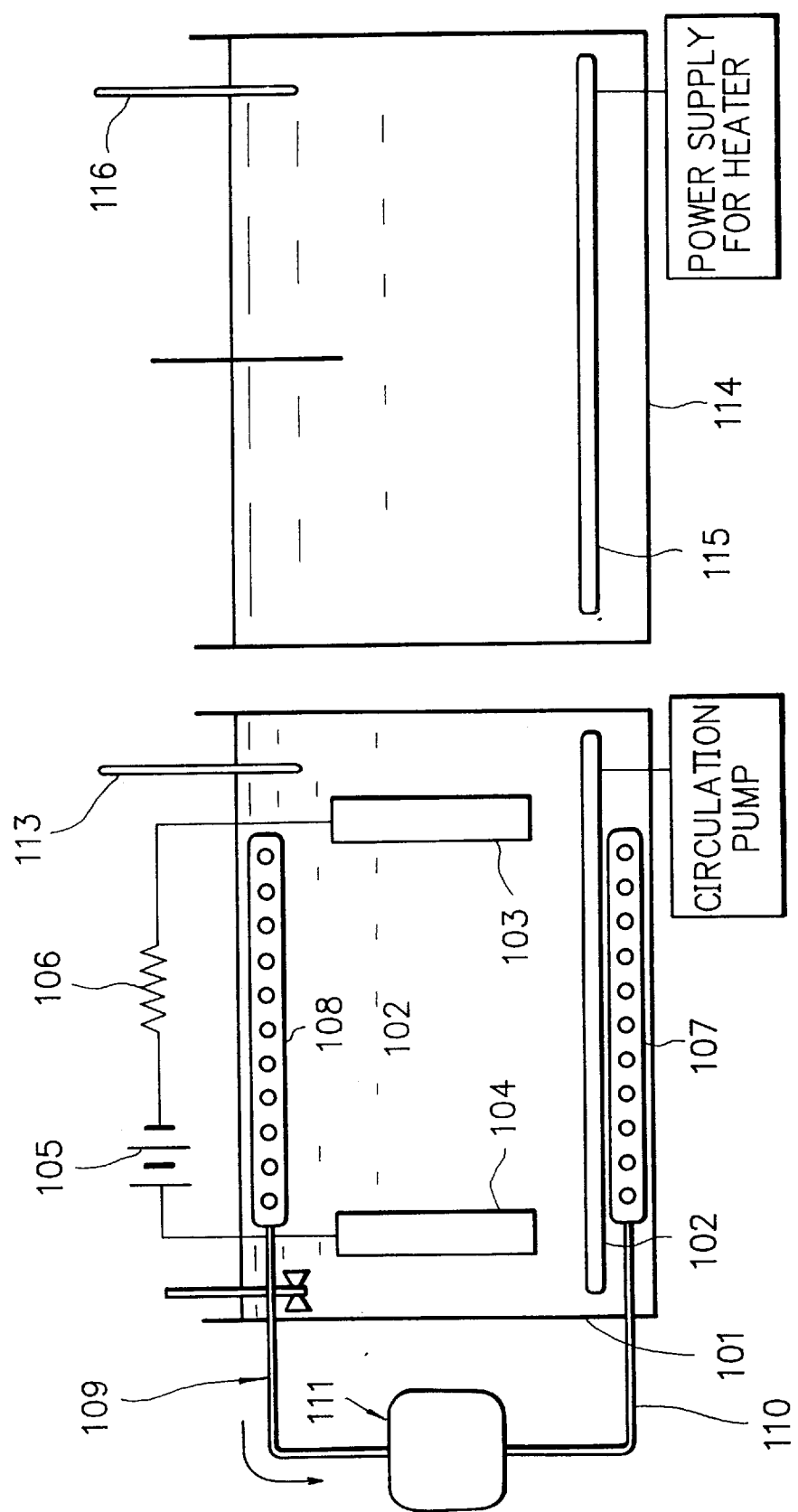
FIG. 1 is a schematic view of an apparatus for the production of a zinc oxide thin film according to the present invention.

FIG. 1 shows one example of an apparatus for the formation of a zinc oxide film according to the present invention.

Reference numeral 101 indicates an anticorrosion vessel filled with an aqueous solution 102 containing nitrate ions, zinc ions, and a carbohydrate. In order to obtain a desired zinc oxide film, each of the concentration of nitrate ions and zinc ions is preferably in a range from 0.001 mol/l to 1.0 mol/l, more preferably, in a range from 0.01 mol/l to 0.5 mol/l, most preferably, in a range from 0.1 mol/l to 0.25 mol/l.

The supply sources for nitrate ions and zinc ions are not particularly limited. For example, there may be used zinc nitrate which is a supply source capable of commonly supplying nitrate ions and zinc ions, and a mixture of a water-soluble nitrate such as ammonium nitrate as a supply source for nitrate ions and a zinc salt such as zinc sulfate as a supply source for zinc ions.

The kinds of the carbohydrate are not particularly limited. For example, there can be used a monosaccharide such as glucose (grape sugar) or fructose (fruit sugar), a disaccharide such as maltose (malt sugar) or sucrose (cane sugar), and a polysaccharide such as dextrin or starch, and the mixture thereof.

In order to obtain a zinc oxide thin film with excellent without abnormal growth, the content of the carbohydrate in the aqueous solution is preferably in a range from 0.001 g/l to 300 g/l, more preferably, in a range from 0.005 g/l to 100 g/l, most preferably, in a range from 0.01 g/l to 60 g/l.

Reference numeral 103 indicates a conductive substrate which is taken as a cathode, and 104 is a counter electrode which is made of a metal such as platinum, or carbon, other than zinc used for deposition on the substrate in an aqueous phase. In addition, the counter electrode 104 is taken as a positive electrode. The substrate 103 as the cathode and the counter electrode 104 as the positive electrode are connected to a power supply 105 via a load resistance 106, and a substantially specified current is carried therebetween from the power supply 105. In order to obtain a desired zinc oxide film, the current density is preferably in a range from 10 $mA/dm^2$ to 10 $A/dm^2$.

In order to reduce the uneven formation of a layer by circulation of the solution and hence to increase the layer forming rate with the enhanced efficiency, there is used a solution circulating system including a suction bar 108 having a plurality of solution sucking ports, an injection bar having a plurality of solution injecting ports, a solution circulating pump 111, a sucked solution flowing pipe 109 connecting the suction bar 108 to the solution circulating pump 111, and an injecting solution flowing pipe 110 connecting the solution injecting bar 107 to the solution circulating pump 111. For a small-scaled apparatus, such a solution circulating system may be replaced with a magnetic stirrer.

In this apparatus, the temperature of the aqueous solution is controlled while being monitored by a heater 112 and a thermocouple 113. In order to obtain a desired zinc oxide film, the temperature of the aqueous solution is preferably 50° C. or more. In addition, after deposition of a first zinc oxide film, a second zinc oxide film may be subsequently deposited under a different condition.

In order to heat the substrate 103 before preparation of a zinc oxide film, the substrate 103 may be immersed in a hot water tank 114. The hot water tank 114 is filled with hot water adjusted in temperature by a heater 115 and a thermocouple 116 for heating the substrate 103.

Continuous Forming Apparatus

FIG. 2 shows an apparatus capable of continuously forming a zinc oxide layer on the surface of a web of a flexible conductive substrate 201 electrolysis using an aqueous solution.

The back surface of the conductive substrate 201 is stuck with an insulating tape (not shown) for preventing the deposition of a zinc oxide film thereon. Reference numeral 201 indicates a feed roller around which the substrate web 201 is wound, and 203 is a take-up roller around which the substrate web 201 is wound after being processed via a plurality of carrier rollers 204. The diameter of each roller is required to be determined on the basis of the material of the substrate web 201 for preventing plastic deformation of the substrate web 201.

Reference numeral 205 indicates a hot water tank for heating the substrate web 201. The hot water tank 205 is connected to a circulation system 206 containing a filter for removing contaminants, and it contains a heater 207.

Reference numeral 208 indicates an electrolytic phase deposition tank for forming a zinc oxide layer, which is connected to a circulation system 209 containing a filter for removing contaminants. The tank 208 also contains a zinc electrode 210 and a heater 211, and is connected to an external power supply 212. The circulation system 209 has a system for monitoring the concentration of the solution, and adding a new one if necessary.

Reference numeral 213 indicates a cleaning tank connected to a circulation system 214 containing a filter for removing contaminants, and 215 is a drying chamber for drying the substrate web 201 by hot air.

A zinc oxide film can be formed at a reduced cost using such an apparatus.

(Substrate)

The substrate used for the present invention is mainly composed of a support made of a magnetic or non-magnetic metal. In particular, there may be suitably used a stainless steel sheet, steel sheet, copper sheet, brass sheet, or an aluminum sheet in terms of the low material cost.

Such a metal sheet may be cut into a specified shape, or in the form of a web depending on the thickness. The web of a metal sheet can be wound in a coil, and thereby it is suitable for continuous production, and also it is easier to store and transform. In addition, in some applications, a crystalline substrate such as silicon, or a glass or ceramic sheet can be used. The surface of the support may be ground, but in the case of a stainless steel sheet subjected to bright-annealing, it can be used as it is.

Application to photoelectric conversion device

FIG. 3 is a schematic sectional view of a photoelectric conversion device using a zinc oxide thin film formed in accordance with the process of the present invention. In this figure, reference numeral 301-1 indicates a support, 301-2 indicates a metal layer, 301-2 is a transparent conductive layer; 302 is a zinc oxide layer formed in the process of the present invention; 303 is a semiconductor layer; 304 is a transparent conductive layer; and 305 is a collecting electrode. The support 301-1, metal layer 301-2, and transparent conductive layer 301-3 constitute a conductive substrate 301 of the present invention.

The zinc oxide layer 302 may be of a stack structure of a plurality layers different in size and orientation of crystal grains of zinc oxide.

Rays of sunlight impinge through the transparent conductive layer 304 to the photoelectric conversion device. Rays of light having short-wavelengths less than 500 nm are mostly absorbed in the next semiconductor layer 303. On the other hand, rays of light having wavelengths longer than the order of 700 nm which is longer than the optical absorption end, part of these rays are transmitted through the semiconductor layer 303, passing through the zinc oxide film 302 as the transmission layer, and are reflected from the metal layer 301-2 or support 301-1. The rays of light thus reflected again pass through the zinc oxide film 302 as the transmission layer, and are partially or mostly absorbed in the semiconductor layer 303.

At this time, if the support 301-1 and/or metal layer 301-2 and/or zinc oxide layer 302 as the transparent layer and/or semiconductor layer 303 are formed with textured surfaces having larger sizes sufficient to tilt the optical path, the optical path length of the rays of light transmitted in the semiconductor layer 303 is extended by the tilting of the optical path, so that it can be expected that light absorption increases. The increase in light absorption is extremely small for a layer which is substantially transparent to rays of light; however, for a region capable of absorbing rays of light to some extent, that is, for a region made of a material having an optical absorption edge close to the wavelength of rays of light, light absorption in the region is exponentially increased. Since the zinc oxide layer 302 as the transparent layer is transparent to rays of light in a range from visible light to near infrared radiation, rays of light in a wavelength range from 600 nm to 1200 nm are absorbed in the semiconductor layer 303.

The metal layer 301-2 is not necessarily used; however, for a material having a low reflectance such as a stainless steel or steel, or a material having a low conductivity such as glass or ceramic, the metal layer 301-2 made of a material having a high reflectance such as gold or aluminum is preferably provided on the support made of the above material having a low reflectance or a low conductivity. Additionally, in the case of using the metal layer 301-2 made of aluminum, an extremely thin transparent conductive layer 301-3 is formed on the metal layer 301-2 in order to prevent aluminum from being dissolved in the aqueous solution.

(Semiconductor layer)

The semiconductor layer may be of a structure of a pn-junction, pin-junction, Schottky-junction, or heterojunction, and as the semiconductor material, there may be used a hydrogenated amorphous silicon, hydrogenated amorphous silicon-germanium, hydrogenated amorphous silicon- carbide, micro-crystal silicon, or polycrystalline silicon.

In particular, a material such as Si, C, Ge, or an alloy thereof in the amorphous or micro-crystal form is suitably used to be continuously formed on a web of a substrate. At the same time, the material contains hydrogen and/or halogen atoms preferably in a range from 0.1 to 40 atomic %. The material may contain an impurity such as oxygen or nitrogen in a concentration of from $5\times10^{19}$ cm$^{-3}$. Additionally, the material is doped with a group III element for forming a p-type semiconductor, and is doped with a group V element for forming an n-type semiconductor.

In the stacked cell, it is desired that an i-type semiconductor layer of a pin junction disposed near the light incident side has a wide band gap, and an i-type layer of a pin junction disposed more apart from the light incident side has a narrower band gap. Additionally, in the i-type layer, it is desired that the minimum value of the band gap is located at a position shifted to the p-type layer from the center of the film thickness.

The doped layer on the light incident side may be formed of a crystalline semiconductor lower in light absorption or a semiconductor with a wide band gap.

(Process for production semiconductor layer)

The above semiconductor layer may be formed by a microwave (MW) plasma CVD process or a radio frequency (RF) plasma CVD process. The semiconductor layer is formed in the following procedure (if necessary, see the drawings of the known film formation apparatus associated with the procedure described below).

(1) A deposition chamber (vacuum chamber) is reduced to a specified pressure.

(2) Material gases such as a source gas and a diluting gas are introduced in the deposition chamber, followed by evacuation using a vacuum pump, to control the deposition chamber at a specified deposition pressure.

(3) A substrate temperature is adjusted at a specified value by control of a heater.

(4) For the MW-CVD, a microwave power oscillated by a microwave power supply is introduced through a waveguide into the deposition chamber from a dielectric window (made of ceramics such as alumina). In addition, when the frequency of a microwave is as low as 100 MHz to 1 GHz, the microwave power can be applied from a metal electrode.

For the RF-CVD, a high frequency power supplied from a high frequency power supply is introduced into the deposition chamber via a discharging electrode.

(5) A plasma of the source gas is generated, being decomposed, to form a deposition film on the substrate placed in the deposition chamber.

In the case of the MW-CVD process, the conditions can be, set as follows: the substrate temperature in the deposition chamber is preferably in a range 100° to 450° C.; the inner pressure of the deposition chamber is preferably in a range from 0.5 to 30 mTorr; the microwave power is preferably in a range from 0.01 to 1 W/cm$^3$; the frequency of the microwave is preferably in a range from 0.1 to 10 GHz; and the deposition rate is preferably in a range from 0.05 to 20 nm/sec.

In the case of the RF-CVD process, the conditions can be set as follows: the frequency of the RF power is preferably in a range from 0.1 to 100 MHz; the substrate temperature in the deposition chamber is preferably in a range from 100° to 350° C.; the inner pressure of the deposition chamber is preferably in a range from 0.1 to 10 Torr; the RF power is preferably in a range from 0.001 to 0.5 W/cm$^3$; and the deposition rate is preferably in a range from 0.01 to 3 nm/sec.

The source gases usable for deposition of a group IV element amorphous semiconductor layer and a group IV compound based amorphous semiconductor layer suitable for a photoelectric conversion device of the present invention may include a gaseous compound containing silicon atoms, such as $SiH_4$ or $Si_2H_6$, and a gaseous compound containing germanium atoms, such as $GeH_4$.

The above source gas may be used in combination with a gaseous compound containing carbon, nitrogen or oxygen.

A gas such as $B_2H_6$ or $BF_3$ is used as a dopant gas for forming a p-type layer, and a gas such as $PH_3$ or $PF_3$ is used as a dopant gas for forming an n-type layer.

In particular, in the case of depositing a micro-crystal semiconductor layer, a polycrystalline semiconductor layer, or a layer lower in light absorption or wider in band gap such as SiC, it is desired that the dilution ratio of the source gas by hydrogen gas is increased and the increased microwave power or RF power is introduced.

(Transparent electrode)

The transparent electrode 107 can serve as a reflection preventive film by suitably setting the film thickness thereof.

The transparent electrode 107 is formed of a compound such as ITO, ZnO or $In_2O_3$ by deposition, CVD, spraying, spin-on coating, or immersion coating. Such a compound may contain a material capable of changing conductivity.

(Collecting electrode)

A collecting electrode 108 is provided for improving collecting efficiency. It is formed by forming a metal in accordance with an electrode pattern by sputtering; printing a conductive paste or solder paste; or fixing a metal wire with a conductive paste.

In addition, protective layers may be formed on both sides of the photoelectric conversion device 100 as needed. At the same time, a reinforcing member such as a steel sheet may be used in combination.

EXAMPLES

Preparation Examples for Zinc Oxide Film

Zinc oxide films were prepared using the same apparatus as that shown in FIG. 1, except that the solution circulating system was omitted. As the cathode 103, there was used a substrate formed of a 0.12 mm thick stainless steel sheet 430BA deposited with a 2,000 Å thick copper film. In addition, the back surface of the substrate was covered with a tape. As the anode 104, there was used a 1 mm thick zinc sheet (4-N).

As the electrolytic solution, there was used an aqueous solution of zinc nitrate, which was added with sucrose in an amount of 2 g per 100 ml. The concentration of zinc nitrate was varied in a range from 0.1M/l to 0.0025M/l. The temperature of the aqueous solution was varied in a range from room temperature to 85° C., and the applied current was varied in a range from 0.3 to 100 mA/cm$^2$ (0.03 to 10 A/dm$^2$). In this apparatus in which the solution flowing system was omitted, the aqueous solution was constantly stirred by a magnetic stirrer.

Example 1-1

Figure 4:
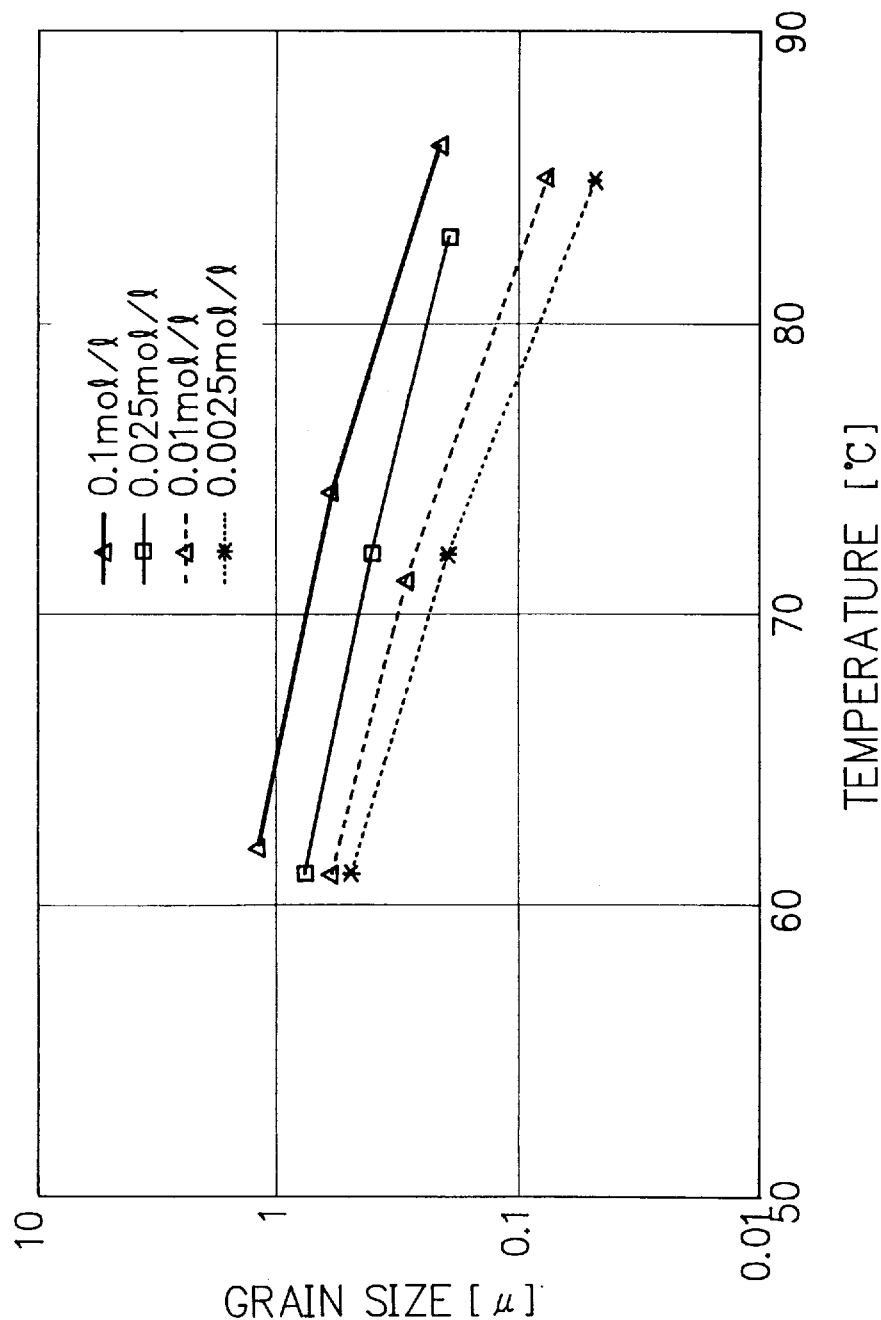
FIG. 4 is a graph showing a temperature dependence on the size of crystal grains of the zinc oxide thin film of the present invention.

The film formation was conducted in the condition in which the applied current density was set at a constant value, about 1 mA/cm$^2$; the concentration of zinc nitrate in the solution was changed at four stages of 0.1M/l, 0.025M/l, 0.01M/l, and 0.0025M/l; and the solution temperature was changed in a range from room temperature to 85° C. In the case where the liquid temperature was 60° C. or more, each of the deposited film was identified as hexagonal zinc oxide by an X-ray diffractometer, and was observed in particle size of crystal grains by SEM. The results of the observation by SEM are shown in FIG. 4. In the case where the solution temperature was 60° C. or less, metallic zinc was also precipitated, and zinc oxide having a specified size was not observed. Moreover, as a result of evaluating the orientation of crystal grains of each film formed at the solution temperature of 60° C. or more, it was found that, for the film prepared at the concentration of zinc nitrate of 0.1M/l, the crystal grains are so grown that the c-axes thereof are oblique to the substrate, that is, the hexagonal planes thereof are inclined to the substrate; and for the film prepared at the concentration of zinc nitrate of 0.025M/l or less, the crystal grains are grown with the C-axes oriented perpendicularly to the substrate.

Example 1-2

Figure 5:
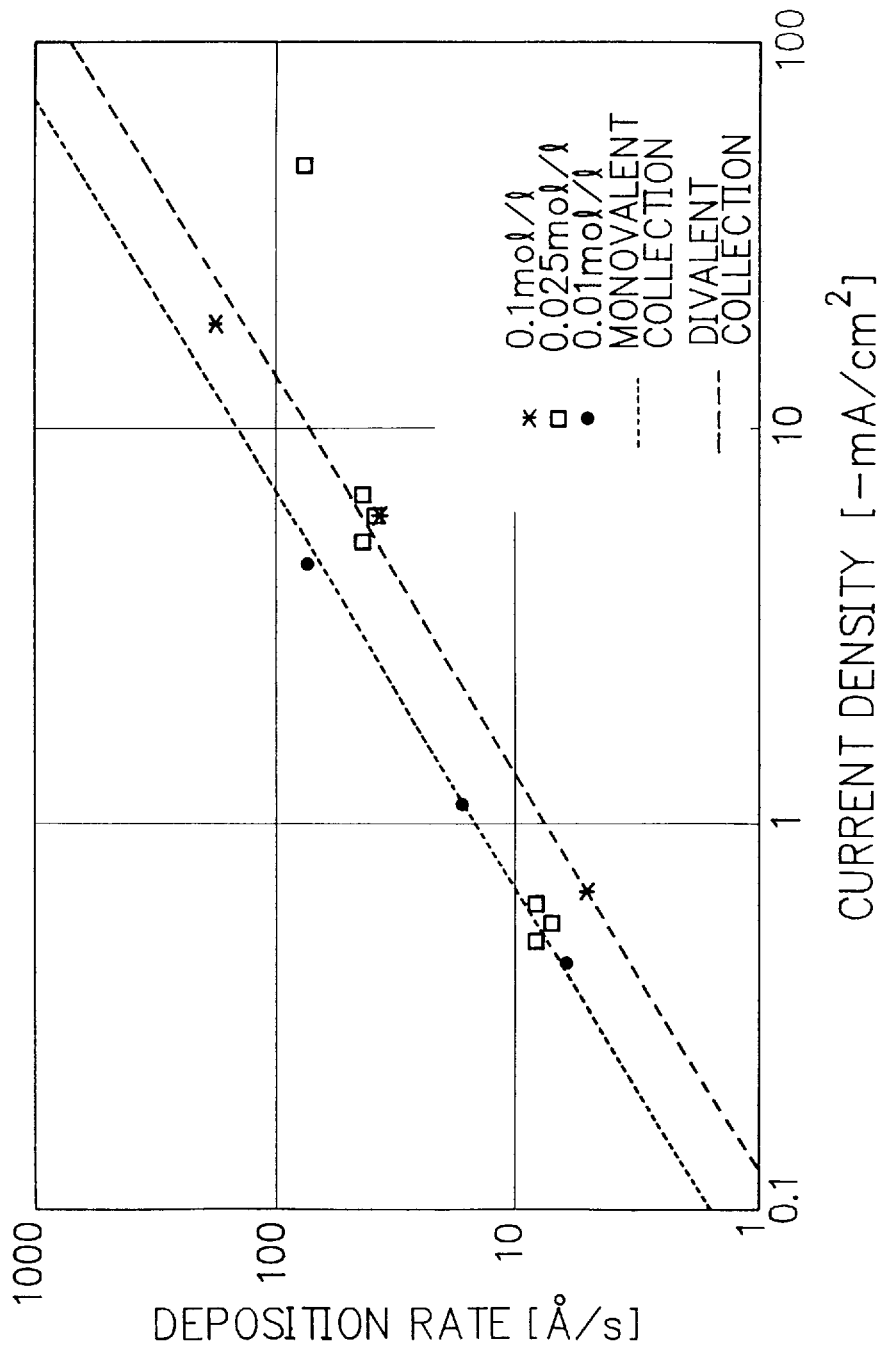
FIG. 5 is a graph showing a current density dependence on a deposition rate in the formation of the zinc oxide thin film of the present invention.

Next, the film formation was conducted with the solution temperature set at a constant value, 65° C.; the concentration of zinc nitrate of the solution was changed at three stages of 0.1M/l, 0.025M/l, and 0.01M/l; and the applied current density was varied in a range from about 0.5 mA/cm$^2$ to about 100 mA/cm$^2$. The applied current density dependence on the deposition rate is shown in FIG. 5. At any concentration of zinc nitrate, the deposition rate increases substantially linearly when the applied current density is less than about 5 mA/cm$^2$. When the applied current density exceeds 5 mA/cm$^2$, the deposition rate becomes sub-linear, and abnormal growth is observed by SEM. In addition, at this time, precipitation of not zinc oxide, but metallic zinc, is also observed by SEM; however, such precipitation can be prevented by solution circulation. The circulation allows a desired film to be deposited in a range from 1 to 100 mA/cm$^2$ of the applied current density. Accordingly, it becomes apparent that the supply of the growth agent from the solution system determines the deposition reaction. In this example, it was found that irrespective of the deposition rate, for the film prepared at the concentration of zinc nitrate of 0.1M/l, the crystal grains are so grown that the c-axes are oblique to the substrate; and for the film prepared at the concentration of zinc nitrate of 0.025M/l or 0.01M/l, the crystal grains are grown in a manner that the c-axes are perpendicular to the substrate.

Figure 6:
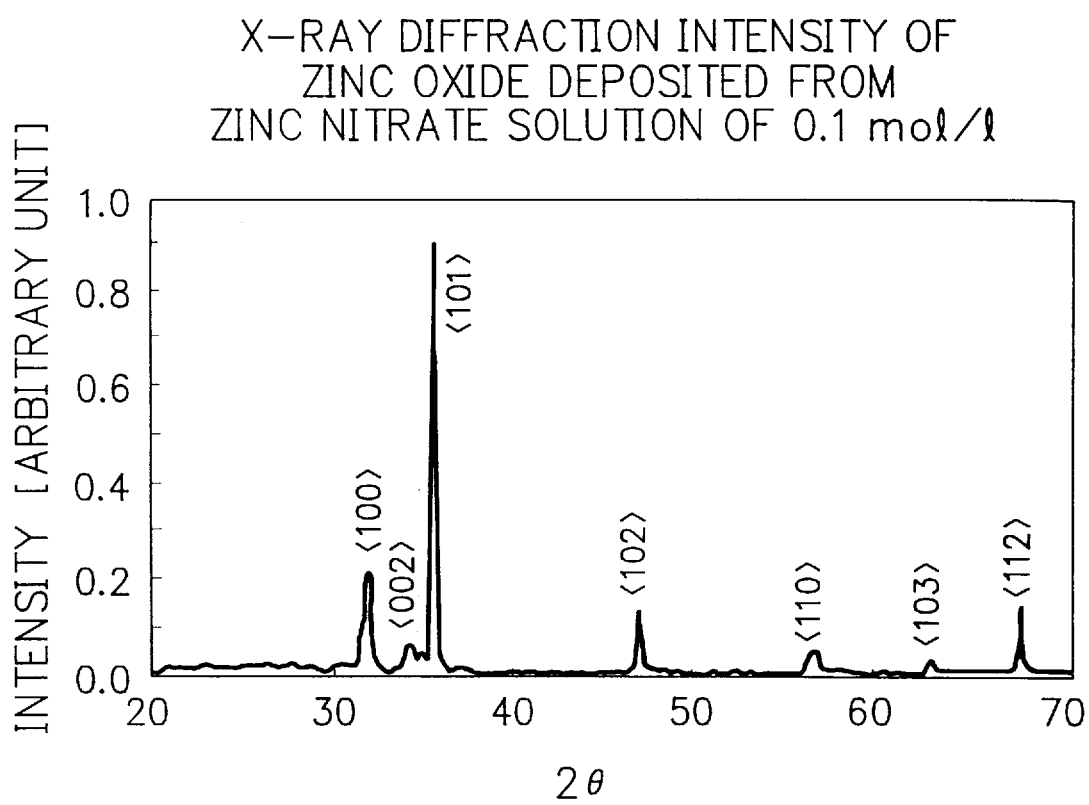
FIG. 6 is a diagram showing an X-ray diffraction strength pattern of a zinc oxide layer prepared when the concentration of zinc nitrate is set at 0.1 mol/l.
Figure 7:
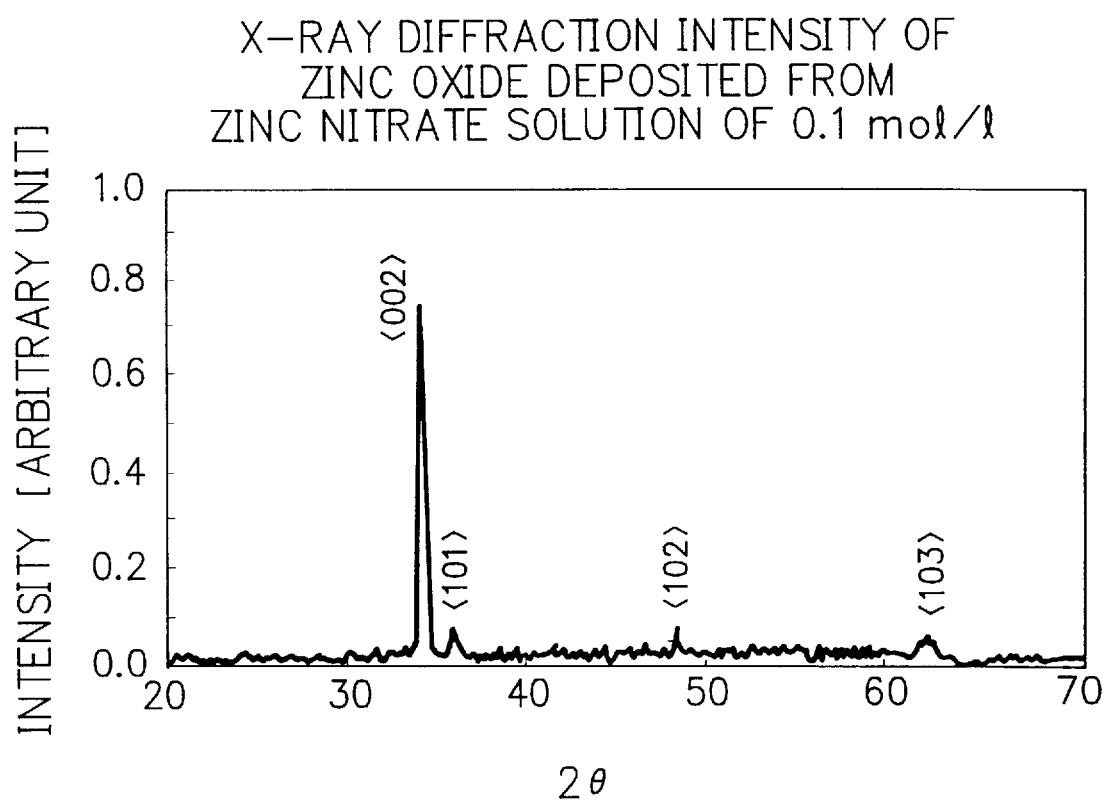
FIG. 7 is a diagram showing an X-ray diffraction strength pattern of a zinc oxide layer prepared when the concentration of zinc nitrate is set at 0.025 mol/l.

FIG. 6 shows the X-ray diffraction pattern of the sample which is prepared at the concentration of zinc nitrate of 0.1M/l and has crystal grains so grown that the c-axes are oblique to the substrate, and FIG. 7 shows the X-ray diffraction of the sample which is prepared at the concentration of zinc nitrate of 0.025M/l and has crystal grains so grown that the c-axes are perpendicular to the substrate. In these X-ray diffraction patterns, the influence of the substrate is corrected. As a respect of the observation by SEM, there is a clear difference between the above two samples. That is, in the sample having the X-ray diffraction pattern shown in FIG. 6, there is observed a morphology in a manner that hexagonal planes of the crystal grains are inclined; while in the sample having the X-ray diffraction pattern shown in FIG. 7, there is observed only the hexagonal faces of the crystal grains in the SEM image field. The change in solution temperature only changes sizes of the crystal grains and exerts no effect on the morphology of the crystal grains observed by SEM.

In order to determine whether the deposition reaction is dominated by monovalent ions or divalent ions, a deposition rate is estimated based on the density of zinc oxide by calculation. The calculated results are shown by the broken lines in FIG. 5. As a result, it is found that monovalent ions are sufficiently related to the deposition reaction, that is, dominate the deposition reaction. Accordingly, it is estimated that the important factor for the growth of zinc oxide from the solution is Zn(NO$_3$)$^+$.

That is, as described above, it is found that the deposition of zinc oxide preferably proceeds at a temperature higher than about 50° C.; the size of crystal grains of zinc oxide is dependent on the concentration and the temperature of the solution; the deposition rate is dependent on the current density of the applied current; the orientation of crystal grains is dependent on the concentration of the solution; and the dominant factor for the orientation may be Zn(NO$_3$)$^+$. This shows that a zinc oxide film having specified crystal grains can be formed in a specified orientation (with the c-axes oriented perpendicularly or obliquely to the substrate) by suitably selecting the concentration and the temperature of the solution containing zinc nitrate and sucrose.

Example 2-1

A 3,000 Å thick zinc oxide film was deposited from an electrolytic solution on a substrate formed of a 5 cm×5 cm sized stainless steel sheet (430BA). That is, the film formation was conducted by preparing an aqueous solution containing zinc nitrate in the concentration of 0.1M/l and 20 g/l of sucrose; immersing a zinc plate (purity: 99.99%) as a positive electrode and the stainless steel substrate as a cathode, spaced at a distance of 3.5 cm, in the solution kept at 70° C.; and applying a current of 20 mA using a galvanostat between both the electrodes while stirring the solution. In this electrolysis, after 10 min, there was deposited a zinc oxide film exhibiting a hazy surface due to scattering of light. The hydrogen ion concentration (pH) of the solution was 5.4. The substrate deposited with a zinc oxide film was dewatered by compressed air. The film thus obtained is taken as a film "a".

Example 2-2

The procedures of Example 2-1 were repeated, except that the aqueous solution in Example 2-1 was diluted 40 times with pure water and the solution temperature was kept at 85° C., to thereby obtain a 3,000 Å thick zinc oxide film exhibiting a transparent interference color. In addition, the pH of the solution was 6.4. The film thus obtained is taken as a film "b".

Reference Example 2-3

In this example, a zinc oxide film was deposited on the same stainless steel substrate as in Example 2-1 by DC magnetron sputtering. That is, a target of zinc oxide was sputtered for 5 min at a pressure of 10 mTorr and at a DC power of 100 W while allowing Ar gas to flow at a flow rate of 2 sccm, to thereby obtain a 3,000 Å thick zinc oxide transparent film exhibiting an interference color similar to that in Example 2-2. Such a film is taken as a film "c".

Reference Example 2-4

The procedures of Reference Example 2-3 were repeated, except that the film thickness of a zinc oxide film was set at a value being 5 times larger that of the film prepared in Reference Example 2-3. The deposition time was set at a value being 5 times that in Reference Example 2-3 for increasing the film thickness. Thus, there was obtain a 1.5 $\mu$m thick zinc oxide transparent film exhibiting an interference color. Such a film is taken as a film "d".

Example 2-5

An about 1,000 Å thick zinc oxide transparent layer exhibiting an interference color was deposited in same procedure as in Example 2-2, except that the deposition time was set at 3 min. After that, an about 2,000 Å thick zinc oxide layer was stacked on the previous zinc oxide layer by electrolysis in the same procedure as that in Example 2-1, except that the stainless steel substrate deposited with the about 1,000 Å thick zinc oxide layer was used as an electrode and the deposition time was set at 7 min. Such a double-layered film is taken as a film "e".

With respect to the total reflection spectrum, the film "a" exhibited an extremely excellent scattering characteristic in which the interference pattern becomes very broad in a near infrared region despite of the thinness of the film.

As a result of observing the films "a" to "e" by SEM, it was found that each of the films "a" and "e" has a structure of petal-like polycrystals each having a diameter of about 1.2 $\mu$m; the film "b" has a structure of tile-like polycrystals each having a diameter of about 0.1 $\mu$m, and each of the films "c" and "d" has a shape being so small as not to be observed by SEM because of insufficient resolution therefor and thereby not to be evaluated in orientation but is recognized to be of an aggregate structure of granular grains each having a particle size of several hundred Å.

The films "a" to "c" were evaluated by X-ray diffraction. As shown in FIG. 6, the film "a" is found to be of hexagonal crystal structure whose c-axes are oblique to the substrate. In this film "a", the intensity of X-ray diffraction of <002> was about 30% of the intensity of <101>. In each of the films "b" and "c", the diffraction peak of <002> was dominant. As shown in FIG. 7, the diffraction pattern of the film "b" is found to be of crystal structure having the c-axes oriented perpendicularly to the substrate.

On each of the films "a", "b", "c", "d", and "e", there were sequentially deposited a n-type a-Si semiconductor layer, an i-type SiGe semiconductor layer, and a p-type $\mu$c-Si semiconductor layer by microwave CVD; followed by deposition of a 600 Å thick ITO film, and a grid as an upper collection electrode was formed of Ag. The solar cells thus obtained were evaluated under a solar simulator. As a result, a large difference was found generated in short-circuit current density (Jsc) among the films. That is, the Jsc was 10.2 mA for the film "a"; 9.5 mA for the film "b"; 8.6 mA for the film "c"; 9.3 for the film "d"; and 10.0 mA for the film "e".

The films "a" to "e" were examined in terms of peeling characteristic, wherein each film was bent together with the substrate. The film "a" started to peel at the bending position, and was almost peeled off when being bent back. On the other hand, each of the films "b", "c", "d" and "e" were not observed to peel even when bent at an angle of 180°, which gave the result that the films had excellent adhesion properties.

Application to Photoelectric Conversion Device

Example 3

There was prepared a solar cell having a structure of a support (SUS430, 15×15 cm$^2$ in size, 0.2 mm in thickness)/a metal layer (Ag)/transparent conductive layer (ZnO)/a semiconductor layer/a transparent conductive layer (ITO)/a collecting electrode (Cr), wherein the semiconductor layer was of a structure of three p-i-n junctions.

A metal layer (Ag) was first formed on a support by sputtering, to prepare a conductive substrate. On the conductive substrate previously heated by immersion in a hot water tank (see FIG. 1) filled with hot water kept at 85° C., there was formed a 2.0 $\mu$m thick transparent conductive layer (ZnO) using an aqueous solution containing nitrate ions, zinc ions, and glucose in respective amounts shown in Table 1.

On the transparent conductive layer (ZnO), there was formed, by plasma CVD, a semiconductor layer having a structure of a first n-type layer (a-Si:H doped with p)/a first i-type layer (a-SiGe:H)/a first p-type layer ($\mu$c-Si:H doped with B)/a second n-type layer (a-Si:H doped with P)/a second i-type layer (a-SiGe:H)/a second p-type layer ($\mu$c-Si:H doped with B)/a third n-type layer (a-Si:H doped with P)/a third i-type layer (a-SiGe:H)/a third p-type layer ($\mu$c-Si:H doped with B). On the semiconductor layer, there was formed a transparent conductive layer (ITO) of 100 circular regions (sub cells) each 1 cm$^2$ using a mask by a known sputtering process, and on each of the sub cells, there was formed a collecting electrode by a known vacuum deposition process.

Comparative Example 1

A solar cell shown in FIG. 3, including a semiconductor layer having three p-i-n junctions as in Example 3, was prepared by repeating the procedures of Example 3, except that a transparent conductive layer (ZnO) was formed under the conditions shown in Table 2. Like Example 3, on the semiconductor layer, there was formed a transparent conductor layer (ITO) 100 of circular regions (sub cells) each 1 cm² as shown in FIG. 3, and on each sub cell, there was formed a collecting electrode.

The solar cells in Example 3 and Comparative Example 1 were measured for solar cell characteristics under a solar cell simulator (AM 1.5, 100 mW/cm², surface temperature 25° C.). At the same time, these solar cells were measured in shunt resistance (Rsh) for examining the degree of leak current. As for the shunt resistance, a solar cell having a quality over a criterion set in terms of practical usability was regarded as acceptable, and the degree of abnormal growth of a zinc oxide thin film was evaluated from the acceptable ratio. Next, the sub cells regarded as acceptable were examined in solar cell characteristics (photoelectric conversion efficiency), and the zinc oxide thin film was evaluated in uniformity by examining the variations, that is, the standard deviation in the photoelectric conversion efficiency of the sub cells. Additionally, the solar cell after being subjected to a HH test (high temperature-high humidity test) was evaluated for adhesion using a cross-cut adhesion test. The HH test was conducted by putting each solar cell in an environmental test box, and holding it therein for 100 hr at a temperature of 85° C. and at a humidity of 85%. The cross-cut adhesion test was conducted by cutting lines having a depth reaching the support in a lattice patten (interval: 1 mm) in the solar cell taken off from the environmental test box using a cutter knife; sticking an adhesive tape on the cutting lines formed in the lattice pattern, followed by removing the tape, and visually observing the sticking state of the tape.

As a result, it was found that the solar cell in Example 3 was superior to that in Comparative Example 1 in terms of acceptable ratio, standard deviation of photoelectric conversion efficiency in acceptable sub cells, and adhesion property by the cross-cut adhesion test. In particular, the standard deviation in photoelectric conversion efficiency for acceptable sub cells in Example 3 was as small as being one-fifth of that in Comparative Example 1.

Example 4

A solar cell was prepared by repeating the procedures of Example 3, except that glucose used in Example 3 was replaced with sucrose. The film formation conditions were shown in Table 3.

As a result, it was found that the solar cell in Example 4 was superior to that in Comparative Example 1 in terms of acceptable ratio, standard deviation in photoelectric conversion efficiency of acceptable sub cells, and adhesion property performed by the cross-cut adhesion test. In particular, the acceptable ratio was found to reach 100%.

Example 5

A solar cell was prepared by repeating the procedures of Example 3, except that glucose used in Example 3 was replaced with dextrin. The film formation conditions are shown in Table 4.

As a result, it was found that the solar cell in Example 5 was superior to that in Comparative Example 1 in terms of acceptable ratio, standard deviation in photoelectric conversion efficiency of acceptable sub cells, and adhesion property performed by the cross-cut adhesion test. In particular, the solar cell in this example had excellent adhesion in cross-cut adhesion test.

Example 6

A solar cell was prepared by repeating the procedures of Example 3, except that glucose used in Example 3 was replaced with a mixture of glucose, sucrose and dextrin. The film formation conditions are shown in Table 5.

As a result, it was found that the solar cell in Example 6 was superior to that in Comparative Example 1 in terms of acceptable ratio, standard deviation in photoelectric conversion efficiency of acceptable sub cells, and adhesion performed by the cross-cut adhesion test.

Example 7

A solar cell was prepared by repeating the procedure of Example 6, except that the concentration of nitrate ions was set at a value twice that in Example 6. The film formation conditions are shown in Table 6.

As a result, it was found that the solar cell in Example 7 was superior to that in Comparative Example 1 in terms of acceptable ratio, standard deviation in photoelectric conversion efficiency of acceptable sub cells, and adhesion performed by the cross-cut adhesion test.

Example 8

There were prepared samples in each of which a 2.0 µm thick ZnO film was formed on an NESA glass under the conditions shown in Table 7 using the apparatus shown in FIG. 1. Six kinds of the samples were prepared with the temperature changed as shown in Table 7. The samples were measured in optical transmittance by a spectrometer, and compared with each other in terms of optical transmittance at a wavelength of 800 nm. As a result, it was found that the five samples prepared at the solution temperatures in a range of 50° C. or more exhibited optical transmittance nearly equal to each other; however, the sample prepared at the solution temperature of 40° C. exhibited an optical transmittance 10% lower than that of the samples prepared at the solution temperatures 50° C. or more.

Subsequently, photoelectric conversion devices were prepared in the same procedures as those in Example 3.

The solar cells in Example 8 were measured in solar cell performance under a solar cell simulator (AM 1.5, 100 mW/cm², surface temperature 25° C.). As a result, it was found that the five samples prepared at the solution temperatures 50° C. or more exhibited photoelectric conversion efficiencies nearly equal to each other; however, the sample prepared at the solution temperature of 40° C. exhibited a photoelectric conversion efficiency 10% lower than that of the samples prepared at the solution temperatures 50° C. or more.

Consequently, it becomes apparent that a high quality photoelectric conversion device can be produced by setting the temperature of the solution containing nitrate ions, zinc ions, and a carbohydrate in a range of 50° C. or more.

Example 9

There were prepared samples in each of which a 2.0 µm thick ZnO film was formed on an NESA glass under the conditions shown in Table 8 using the apparatus shown in FIG. 1. Six kinds of samples were prepared with the current density changed as shown in Table 8. The samples were measured in optical transmittance by a spectrometer, and compared with each other in terms of optical transmittance at a wavelength of 800 nm. As a result, it was found that the four samples prepared at the current densities in a range from 10 mA/dm² to 10 A/dm² exhibited optical transmittances nearly equal to each other; however, the samples prepared at the current densities of 5 mA/dm² and 20 A/dm² exhibited optical transmittances 5% lower than those of the samples prepared at the current densities in a range from 10 mA/dm² to 10 A/dm².

Subsequently, photoelectric conversion devices were prepared in the same procedure as those in Example 3.

The solar cells in Example 9 were measured in solar cell performance under a solar cell simulator (AM 1.5, 100 mW/cm², surface temperature 25° C.). As a result, it was found that the four samples prepared at the current densities in a range from 10 mA/dm² to 10 A/dm² exhibited photoelectric conversion efficiencies nearly equal to each other; however, the samples prepared at the current densities of 5 mA/dm² and 20 A/dm² exhibited photoelectric conversion efficiencies 5% lower than those of the samples prepared at the current densities in a range from 10 mA/dm² to 10 A/dm².

Consequently, it becomes apparent that a high quality photoelectric conversion device can be prepared by setting the applied current densities in a range of from 10 mA/dm² to 10 A/dm².

Example 10

In this example, a first zinc oxide layer was prepared in the same manner as in Example 6, except that the concentration of zinc ions in Example 6 was decreased to be half and the applied current density in Example 6 was doubled (see Table 9); and then a second zinc oxide layer was prepared in the same manner as in Example 6, under the conditions that the concentration of zinc ions upon the preparation of the first zinc oxide layer was decreased by half and the applied current density upon the preparation of the first zinc oxide layer was decreased to be one-tenth (see Table 10). After that, a photoelectric conversion device was prepared by repeating the procedures of Example 3.

As a result, it was found that the solar cell in Example 10 was superior to that in Comparative Example 1 in terms of acceptable ratio, standard deviation in photoelectric conversion efficiency of acceptable sub cells, and adhesion property performed by the cross-cut adhesion test.

Example 11

In this example, solar cells each having the configuration of FIG. 3 were prepared on a long belt-shaped support (web). As a semiconductor layer, there was used a type having three p-i-n junctions like Example 3. The film formation was conducted using a roll-to-roll process with a high productivity.

First, on the support made of SUS430BA (thickness: 0.15 mm), there was formed a 0.1 μm thick metal layer made of aluminum and a 0.1 μm thick transparent conductive layer by sputtering using the roll-to-roll process, to thereby prepare a conductive substrate 401. After that, a zinc oxide layer was electrochemically formed on the conductive substrate 401 using the apparatus shown in FIG. 2 in the conditions shown in Table 11.

Then, each solar cell similar to that in Example 3 was prepared by a roll-to-roll apparatus.

As a result, it was found that each of the solar cells in Example 9 was superior to that in Comparative Example 1 in terms of acceptable ratio, standard deviation in photoelectric conversion efficiency of acceptable sub cells, and adhesion performed by the cross-cut adhesion test. In particular, the solar cell in this example was excellent in adhesion property performed by the cross-cut adhesion test

Example 12-1

In this example, on a substrate (about 5 cm×5 cm in size, 0.12 mm in thickness) made of a stainless steel 430BA, there were formed a first zinc oxide layer under the conditions shown in Table 12 and a second zinc oxide layer under the conditions shown in Table 13. The first and second zinc oxide layers were subjected to SEM observation and X-ray diffraction. As a result, the first zinc oxide layer was found to be composed of crystal grains each having a diameter of about 0.05 μm and being oriented with the c-axes perpendicularly to the substrate; and the second zinc oxide layer was found to be composed of crystal grains each having a diameter of about 0.3 μm and being oriented with the <101> directions perpendicularly to the substrate.

After that, on the zinc oxide layers, there was formed by CVD a semiconductor layer having a three-layered structure of a 200 Å thick n-type semiconductor layer (a-Si), a 2,000 Å i-type semiconductor layer (a-Si), and a 140 Å thick p-type semiconductor layer (μc-Si). A 650 Å thick ITO film was then formed on the semiconductor layer by heating deposition in an oxidizing atmosphere, to form a transparent conductive film as an upper electrode having an anti-reflection effect. Finally, a grid of Al was deposited on the transparent conductive layer by evaporation, to form an upper collection electrode.

As a result of measuring the short-circuit current density (Jsc) of the device under a solar simulator, the device was found to exhibit the Jsc of 11.0 mA.

Example 12-2

The procedures of Example 12-1 were repeated, except that the first and second zinc oxide layers were formed under the conditions shown in Tables 14 and 15.

The first and second zinc oxide layers were subjected to SEM observation and X-ray diffraction. As a result, the first zinc oxide layer was found to be composed of crystal grains each having a diameter of about 0.05 μm and being oriented with the c-axes perpendicularly to the substrate; and the second zinc oxide layer was found to be composed of crystal grains each having a diameter of about 1.3 μm and being oriented with the c-axes obliquely to the substrate.

As a result of measuring the short-circuit current density (Jsc) of the device under a solar simulator, the device was found to exhibit the Jsc of 11.5 mA.

Comparative Example 2

A photoelectric conversion device was prepared in the same manner as in Example 12-1, except that the zinc oxide layer was not formed. As a result of measuring the Jsc of the device in false sunlight, the device was found to exhibit the Jsc of 7.3 mA. Accordingly, it becomes apparent that the devices prepared in Examples 12-1, 12-2 have excellent characteristics as compared with the device prepared in Comparative Example 2.

Example 13

A substrate (about 5 cm×5 cm in size, 0.12 mm in thickness) made of a stainless steel 430BA was subjected to alkali cleaning, and on the surface thereof, there was formed a 2,000 Å copper film as a metal layer exhibiting an excellent reflecting characteristic in a near infrared region by sputtering, followed by formation of a zinc oxide layer under the same conditions as those in Example 12-2, to thereby prepare a photoelectric conversion device.

As a result of measuring the short-circuit current density (Jsc) of the device under a solar simulator, the device was found to exhibit an excellent value of Jsc, 13.9 mA.

Comparative Example 3

The procedures of Example 14 were repeated, except that the zinc oxide layer was not formed. As a result of measuring the short-circuit current density (Jsc) of the device in false sunlight, the device was found to exhibit the Jsc of 8.3 mA.

Accordingly, it becomes apparent that the device prepared in Example 13 has excellent characteristics as compared with the device prepared in Comparative Example 3.

Example 14

Figure 8:
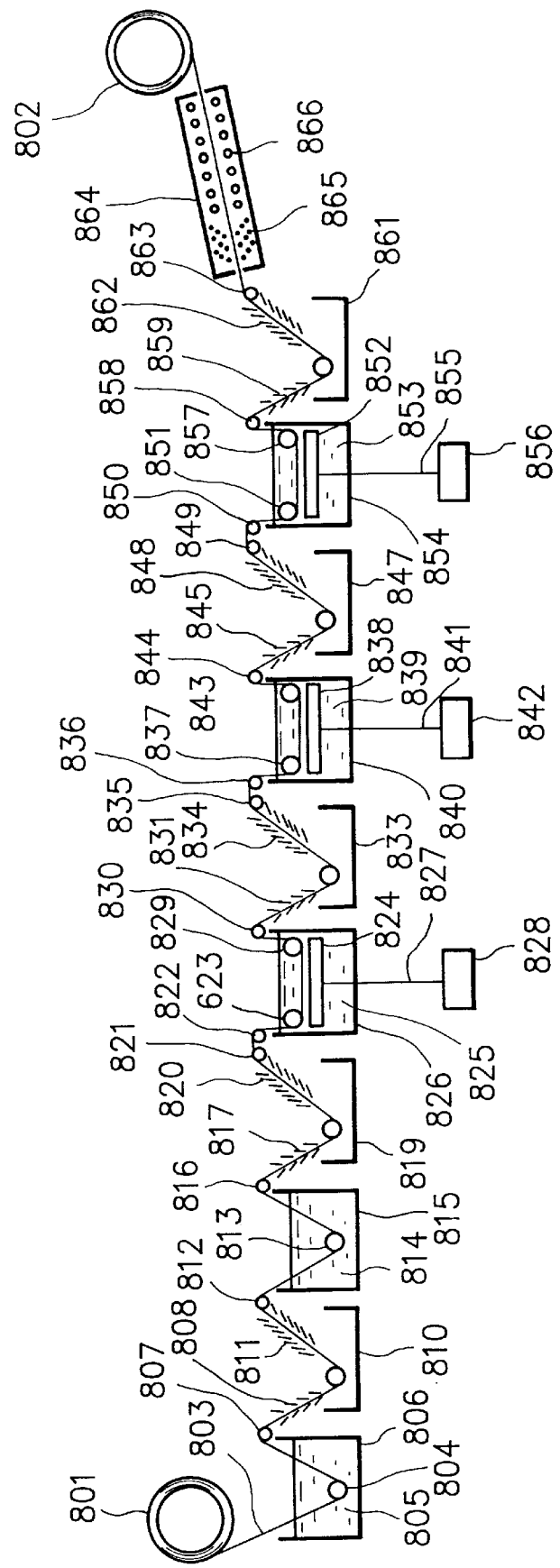
FIG. 8 is an apparatus for the continuous production of a zinc oxide thin film according to the present invention.

There were formed two of zinc oxide layers of the present invention using a continuous forming apparatus shown in FIG. 8.

A rolled support web 803 coated with oil for rust prevention was immersed in a degreasing tank 806 for degreasing the oil. The degreasing tank 806 was filled with an aqueous solution containing 60 ml of sulfuric acid and 70 ml of hydrochloric acid (containing 37% of hydrogen chloride; this is to be repeated in the following) in 1 l of water. The solution temperature was set at room temperature.

The rolled support web 803 was carried in a rinse tank 810 via a carrier roller 807. The rolled support web 803 was sufficiently rinsed by means of rinsing shower nozzles 808 and 811. The water amount is preferably 2 l/min or more.

The rolled support web 803 was carried in an acid etching bath 815 via a carrier roll 812. In the acid etching tank 815, the rolled support web 803 was etched by fluoric acid and nitric acid. An acid etching solution 814 is a mixture of 5 parts by weight of nitric acid, 3 parts by weight of fluoric acid (containing 46% of hydrogen fluoride; this is to be repeated in the following) and 1 part by weight of acetic acid. The solution temperature was set at room temperature. The etching is effective to increase the adhesion property of a metal layer (which will be formed later) to the support. Moreover, the texture formed by the etching plays an effective role in the texture formation of a zinc oxide thin film (which will be formed later), thereby contributing to the formation of a photoelectric conversion device having an effective light confining effect.

The rolled support web 803 was carried into a rinse tank 819 similar to that provided after the degreasing tank. In this rinse tank, an alkali solution may be showered in consideration of the subsequent step of forming a metal layer in an alkali solution.

The rolled support web 803 was carried into a metal layer forming tank 826 via carrier rollers 821 and 822, and a metal layer was formed on the rolled support web 803 in the metal layer forming tank 826. A metal layer forming solution 825 was a solution containing in 1 l of water, 80 g of copper pyrophosphate, 300 g of potassium pyrophosphate, 6 ml of ammonia (specific gravity: 0.88), and 10 g of potassium nitrate. The solution temperature was controlled in a range from 50° to 60° C. The pH was set in a range from 8.2 to 8.8. A copper plate was used as an anode 824. In this apparatus, since the rolled support web 803 is taken as a grounding potential, the current flow in the anode is used for controlling the formation of the layer. In this embodiment, the current density was set at 3 A/dm². The layer forming rate was set at 60 Å/s, and the thickness of the metal layer 802 formed in the metal layer forming solution was 4,000 Å.

After being rinsed in a rinse tank 833, the rolled support web 803 was carried into a first zinc oxide layer forming tank 840 via carrier rollers 835, 836, and a first zinc oxide layer 103 was formed on the surface the rolled support web 803 in the first zinc oxide layer forming tank 840. A first zinc oxide layer forming solution 839 is a solution containing in 1 l of water, 1 g of a hydrated zinc nitrate [$(ZnNO_3)_2 \cdot 6H_2O$] and 20 g of sucrose. The solution temperature was kept at 85° C., and the pH was kept in a range from 5.9 to 6.4. A zinc plate having a surface polished by a buffer was used as a counter electrode 838. A current density of a current flow in the zinc counter electrode 838 was set at 2 A/dm². The layer formation rate was set at 100 Å/s, and the thickness of the first zinc oxide layer 103 was 1 μm.

After being rinsed in a rinse tank 847, the rolled support web 803 was carried into a second zinc oxide layer forming tank 854 via carrier rollers 849, 850, and a second zinc oxide layer 104 was formed on the rolled support 803 in the second zinc oxide layer forming tank 854. A second zinc oxide layer forming solution 853 is a solution containing in 1 l of water, 30 g of a hydrated zinc nitrate [$(ZnNO_3)_2 \cdot 6H_2O$] and 20 g of sucrose. The solution temperature was kept at 75° C., and the pH was kept in a range from 5.2 to 5.8. A zinc plate having a surface polished by a buffer was used as a counter electrode 852. A current density of a current flow in the zinc counter electrode 852 was set at 2 A/dm². The layer formation rate was set at 100 Å/s, and the thickness of the second zinc oxide layer 104 was 1 μm.

The rolled support web 803 was carried into a rinse tank 861, to be rinsed.

After that, the rolled support web 803 was carried into a drying furnace 864 via a carrier roller 863. The drying furnace 864 includes hot air nozzles 865 and infrared radiation heaters 866. The hot air also has a water repellent effect. The hot air from the hot air nozzles 865 was controlled at 150° C., and the infrared heaters 866 were controlled at 200° C. The rolled support web 803 was finally wound around a take-up roller 802.

The process speed of the rolled support web was set at 20 cm/min. A tension applied to the rolled support web was set at 10 kg. The tension was controlled by a tension adjusting clutch (not shown) incorporated in the take-up roller 802.

The metal layer forming tank 826 solution was bubbled by compressed air, and each of the first zinc oxide layer forming tank 840 and the second zinc oxide layer forming tank 854 solution was mechanically stirred. In each of the tanks 826, 840 and 854, the pH of the solution was usually monitored by means of a pH meter containing a temperature calibration mechanism using a glass electrode, and was controlled by addition of ammonia for the metal layer forming tank 826 and by addition of zinc nitrate for each of the first and second zinc oxide layer forming tanks 840 and 854.

After that, a photoelectric conversion device was prepared using the roll-to-roll apparatus.

In this example, although an aqueous solution containing in 1 l of water, 80 g of copper pyrophosphate, 300 g of potassium pyrophosphate, 6 ml of aqueous ammonia (specific gravity: 0.88), and 10 g of potassium nitrate was used as the metal layer forming solution 625, the content of copper pyrophosphate may be changed in a range from 60 to 110 g; the content of potassium pyrophosphate may be changed in a range from 10 to 500 g; the content of aqueous ammonia may be changed in a range from 1 to 10 ml; and the content of potassium nitrate may be changed in a range from 5 to 20 g. The addition of potassium pyrophosphate contributes to texture of the formed copper film, and if the content is excessively larger, the texture is suppressed and also the current density is reduced because of generation of orthophosphate. When the contents of potassium phosphate and aqueous ammonia are smaller, the texture tends to be enlarged. These components are desired to be added to some extent in terms of adhesion property.

In this example, although the aqueous solution containing in 1 l of water, 1 g of hydrated zinc nitrate [$(ZnNO_3)_2 \cdot 6H_2O$], and 20 g of sucrose was selected as the first zinc oxide layer forming solution, the content of hydrated zinc nitrate may be changed in a range from 0.1 to 80 g and the content of sucrose may be changed in a range from 3 to 100 g. In addition, the above solution may be added with 50 ml or less of nitrate, and further added with 3–20 ml of acetic acid for enhancing the management of the pH.

In this example, although the aqueous containing in 1 l of water, 30 g of hydrated zinc nitrate [$(ZnNO_3)_2 \cdot 6H_2O$], and 20 g of sucrose was selected as the second zinc oxide layer forming solution 853, the content of hydrated zinc nitrate may be changed in a range from 1 to 80 g and the content of sucrose may be changed in a range of from 3 to 100 g. The above solution may be added with 50 ml or less of nitrate, and further added with 3–20 ml of acetic acid for enhancing the management of the pH.

Comparative Example 4

The procedures of Example 14 were repeated, except that the copper layer and the zinc oxide layer were deposited on the stainless steel substrate by sputtering, to thereby prepare photoelectric conversion devices. The device in Example 14 exhibited a photoelectric conversion efficiency being 1.4 times as high as that of the device in Comparative Example 4. The excellent photoelectric conversion efficiency of the device according to the present invention is mainly dependent on the improvement in short-circuit current, more concretely, dependent on the fact that the orientation of crystals of the zinc oxide polycrystalline film in which crystals are grown with c-axes oriented obliquely to the substrate exerts an extremely desirable effect on the light confining function of the photoelectric conversion device.

Next, each device was subjected to the endurance test by putting the device in an environmental test box in the condition of 85° C.-85 RH while applying a reverse bias of 1 V, and monitoring the change in performance with time. As a result, it was found that the device in Comparative Example 4 was close to the unusable shunt level after 10 min. after an elapse and eventually reached a unusable state 1 hour after the elapse; however, the device in Example 14 remained in the usable region for 16 hr. This shows that the device of the present invention exhibits excellent characteristics.

Example 15

The rinsing temperatures and the solution temperatures throughout the production steps conducted by the apparatus shown in FIG. 8 were kept at about 75° C. In this example, a mixture of nitric acid, fluoric acid and acetic acid in the mixing ratio of 3:2:3 was used as the etching solution; the same solution as that in Example 14 was used as the metal layer forming solution; a solution containing in 1 l of water, 3 g of hydrated zinc nitrate [$(ZnNO_3)_2 \cdot 6H_2O$], 2 ml of nitric acid, 1 ml of acetic acid, and 90 g of sucrose was used as the first zinc oxide layer forming solution 839; and a solution containing in 1 l of water, 30 g of hydrated zinc nitrate [$(ZnNO_3)_2 \cdot 6H_2O$], 2 ml of nitric acid, 1 ml of acetic acid, and 90 g of sucrose was used as the second zinc oxide layer forming solution 853. The current density was set at 2 A/dm$^2$ for the metal forming solution; 0.4 A/dm$^2$ for the first zinc oxide layer forming solution 839; and 0.6 A/dm$^2$ for the second zinc oxide layer forming solution 853.

At this time, the layer forming rate was 30 Å/s and the layer thickness was 2,000 Å for the metal layer 202; the layer forming rate was 10 Å/s and the layer thickness was 2,000 Å for the first zinc oxide forming layer 103; and the layer forming rate was 10 Å/s and the layer thickness was 12,000 Å for the second zinc oxide forming layer 104.

After that, each photoelectric conversion device was prepared in the same procedures as in Example 14.

Comparative Example 5

The procedures of Example 15 were repeated, except that the copper layer and the zinc oxide film were deposited on the stainless steel substrate by sputtering, to thereby prepare photoelectric conversion devices. The device in Example 15 exhibited a photoelectric conversion efficiency being 1.17 times that of the device in Comparative Example 5.

Next, the device prepared in this example was subjected to the endurance test by putting the device in an environment testing box under the condition of 85° C.-85 RH while applying a reverse bias of 1 V, and monitoring the change in performance with time. As a result that, it was found that the device stably remained in the usable region for 17 hr. This shows that the device of the present invention exhibits excellent characteristics.

In this example, since the temperature is kept constant throughout the production steps, inconvenience can be avoided because the conditions are different from the original set value each time the rolled support web enters each solution, and consequently, it is possible to shorten the length of the entire apparatus, at a minimum, and hence to reduce the cost of the apparatus and also the cost of the photoelectric conversion device prepared by the apparatus.

TABLE 1

| | |
|---|---|
| concentration of nitrate ion | 0.2 mol/l |
| concentration of zinc ion | 0.2 mol/l |
| pre-heating in hot water tank | presence |
| temperature of hot water tank | 85° C. |
| carbohydrate | glucose |
| amount of carbohydrate | 1.0 g/l |
| temperature of aqueous solution | 85° C. |
| applied current density | 500 mA/dm$^2$ |
| counter electrode | zinc electrode (thickness: 1 mm, 4-N) |

TABLE 2

| | |
|---|---|
| concentration of nitrate ion | 0.2 mol/l |
| concentration of zinc ion | 0.2 mol/l |
| pre-heating in hot water tank | absence |
| temperature of hot water tank | — |
| carbohydrate | absence |
| amount of carbohydrate | — |
| temperature of aqueous solution | 85° C. |
| applied current density | 500 mA/dm$^2$ |
| counter electrode | zinc electrode (thickness: 1 mm, 4-N) |

TABLE 3

| | |
|---|---|
| concentration of nitrate ion | 0.2 mol/l |
| concentration of zinc ion | 0.2 mol/l |
| pre-heating in hot water tank | presence |
| temperature of hot water tank | 85° C. |

TABLE 3-continued

| | |
|---|---|
| carbohydrate | sucrose |
| amount of carbohydrate | 1.0 g/l |
| temperature of aqueous solution | 85° C. |
| applied current density | 500 mA/dm$^2$ |
| counter electrode | zinc electrode (thickness: 1 mm, 4-N) |

TABLE 4

| | |
|---|---|
| concentration of nitrate ion | 0.2 mol/l |
| concentration of zinc ion | 0.2 mol/l |
| pre-heating in hot water tank | presence |
| temperature of hot water tank | 85° C. |
| carbohydrate | dextrin |
| amount of carbohydrate | 0.33 g/l |
| temperature of aqueous solution | 85° C. |
| applied current density | 500 mA/dm$^2$ |
| counter electrode | zinc electrode (thickness: 1 mm, 4-N) |

TABLE 5

| | |
|---|---|
| concentration of nitrate ion | 0.2 mol/l |
| concentration of zinc ion | 0.2 mol/l |
| pre-heating in hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 500 mA/dm$^2$ |
| counter electrode | zinc electrode (thickness: 1 mm, 4-N) |

TABLE 6

| | |
|---|---|
| concentration of zinc nitrate | 0.2 mol/l |
| (concentration of nitrate ion) | (0.4 mol/l) |
| (concentration of zinc ion) | (0.2 mol/l) |
| temperature of hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 500 mA/dm$^2$ |
| counter electrode | zinc electrode (thickness: 1 mm, 4-N) |

TABLE 7

| | |
|---|---|
| concentration of zinc nitrate | 0.2 mol/l |
| (concentration of nitrate ion) | (0.4 mol/l) |
| (concentration of zinc ion) | (0.2 mol/l) |
| pre-heating in hot water tank | presence |

TABLE 7-continued

| | |
|---|---|
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 40, 50, 60, 70, 80, 90° C. |
| applied current density | 500 mA/dm$^2$ |
| counter electrode | zinc electrode (thickness: 1 mm, 4-N) |

TABLE 8

| | |
|---|---|
| concentration of zinc nitrate | 0.2 mol/l |
| (concentration of nitrate ion), | (0.4 mol/l) |
| (concentration of zinc ion) | (0.2 mol/l) |
| temperature of hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 5 mA/dm$^2$, 10 mA/dm$^2$, 100 mA/dm$^2$, 1A/dm$^2$, 10A/dm$^2$, 20 A/dm$^2$ |
| counter electrode | zinc electrode (thickness: 1 mm, 4-N) |

TABLE 9

| | |
|---|---|
| concentration of nitrate ion | 0.1 mol/l |
| (concentration of zinc ion) | (0.2 mol/l) |
| (concentration of zinc ion) | (0.1 mol/l) |
| temperature of hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 1.0 A/dm$^2$ |
| counter electrode | zinc electrode (thickness: 1 mm, 4-N) |

TABLE 10

| | |
|---|---|
| concentration of zinc nitrate | 0.05 mol/l |
| (concentration of nitrate ion) | (0.2 mol/l) |
| (concentration of zinc ion) | (0.05 mol/l) |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 100 mA/dm$^2$ |
| counter electrode | zinc electrode (thickness: 1 mm, 4-N) |

TABLE 11

| | |
|---|---|
| concentration of zinc nitrate | 0.2 mol/l |
| (concentration of nitrate ion) | (0.4 mol/l) |
| (concentration of zinc ion) | (0.2 mol/l) |
| pre-heating in hot watertank | presence |
| temperature of hot water tank | 85° C. |
| carbohydrate | dextrin |
| amount of carbohydrate | 0.2 g/l |
| temperature of aqueous solution | 85° C. |
| applied current density | 800 mA/dm² |
| counter electrode | zinc electrode (thickness: 1 mm, 4-N) |

TABLE 12

<Example 12-1>

| | |
|---|---|
| concentration of zinc nitrate | 0.03 mol/l |
| (concentration of nitrate ion) | (0.06 mol/l) |
| (concentration of zinc ion) | (0.03 mol/l) |
| pre-heating in hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 500 mA/dm² |
| counter electrode | zinc electrode (thickness: 1 mm, 4-N) |

TABLE 13

<Example 12-1>

| | |
|---|---|
| concentration of zinc nitrate | 0.1 mol/l |
| (concentration of nitrate ion) | (0.2 mol/l) |
| (concentration of zinc ion) | (0.1 mol/l) |
| pre-heating in hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 500 mA/dm² |
| counter electrode | zinc electrode (thickness: 1 mm, 4-N) |

TABLE 14

<Example 12-2>

| | |
|---|---|
| concentration of zinc nitrate | 0.02 mol/l |
| (concentration of nitrate ion) | (0.04 mol/l) |
| (concentration of zinc ion) | (0.02 mol/l) |
| pre-heating in hot water tank | presence |

TABLE 14-continued

<Example 12-2>

| | |
|---|---|
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 500 mA/dm² |
| counter electrode | zinc electrode (thickness: 1 mm, 4-N) |

TABLE 15

<Example 12-2>

| | |
|---|---|
| concentration of zinc nitrate | 0.3 mol/l |
| (concentration of nitrate ion) | (0.6 mol/l) |
| (concentration of zinc ion) | (0.3 mol/l) |
| pre-heating in hot water tank | presence |
| temperature of hot water tank | 85° C. |
| carbohydrate | glucose, sucrose, dextrin |
| amount of carbohydrate | glucose 1.0 g/l, sucrose 1.0 g/l, dextrin 0.3 g/l |
| temperature of aqueous solution | 85° C. |
| applied current density | 1.0 mA/dm² |
| counter electrode | zinc electrode (thickness: 1 mm, 4-N) |

What is claimed is:

1. A process for production of a zinc oxide thin film, comprising a step of applying a current between a conductive substrate immersed in an aqueous solution at least containing nitrate ions, zinc ions, and a carbohydrate, with an electrode immersed in said solution, thereby forming a zinc oxide film on said conductive substrate.

2. A process for the production of a zinc oxide thin film according to claim 1, wherein said carbohydrate comprises a monosaccharide, a disaccharide or a polysaccharide.

3. A process for the production of a zinc oxide thin film according to claim 1, wherein said carbohydrate comprises a mixture of two or more kinds of carbohydrates.

4. A process for the production of a zinc oxide thin film according to claim 1, wherein the concentration of said carbohydrate in said aqueous solution is in a range of from 0.001 mol/l to 1.0 mol/l.

5. A process for the production of a zinc oxide thin film according to claim 1, wherein said conductive substrate is one selected from a group consisting of a stainless steel plate, a steel plate, a copper plate, a brass plate, and an aluminum plate.

6. A process for the production of a zinc oxide thin film according to claim 1, wherein said electrode is a zinc electrode.

7. A process for the production of a zinc oxide thin film according to claim 1, wherein the temperature of said aqueous solution is 50° C. or more.

8. A process for the production of a zinc oxide thin film according to claim 1, wherein the current density of said current is 10 mA/dm² to 10 A/dm².

9. A process for production of a zinc oxide thin film according to claim 1, wherein said conductive substrate comprises a support on which a metal layer is formed.

10. A process for the production of a zinc oxide thin film according to claim 9, wherein said metal film is formed by electroplating.

11. A process for the production of a zinc oxide thin film according to claim 9, further comprising the step of etching said support.

12. A process for the production of a zinc oxide thin film according to claim 9, wherein said support is made of glass, ceramics or resin.

13. A process for the production of a zinc oxide thin film according to claim 1, wherein said zinc oxide thin film comprises at least a first zinc oxide thin film and a second zinc oxide thin film.

14. A process for the production of a zinc oxide thin film according to claim 13, wherein said plurality of zinc oxide thin films are formed under conditions that at least one of the concentration of said aqueous solution, the current density, and the temperature of said solution differs.

15. A process for the production of a zinc oxide thin film according to claim 13, wherein the grain size of said first zinc oxide thin film is smaller than that of said second zinc oxide thin film.

16. A process for the production of a zinc oxide thin film according to claim 13, wherein the grain size of said first zinc oxide thin film is one-tenth or less of that of said second zinc oxide thin film.

17. A process for the production of a zinc oxide thin film according to claim 13, wherein the orientation of said first zinc oxide thin film is such that the C-axes of crystal grains of said film are oriented perpendicularly to said substrate, and the orientation of said second zinc oxide thin film is such that the <101> directions of crystal grains of said film are mainly oriented perpendicularly to said substrate.

18. A process for the production of a zinc oxide thin film according to claim 13, wherein said first zinc oxide film is formed by applying a current between said conductive substrate immersed in an aqueous solution containing zinc nitrate in the concentration of 0.03 mol/l or less and a carbohydrate, and said electrode immersed in said solution.

19. A process for the production of a zinc oxide thin film according to claim 13, wherein said second zinc oxide film is formed by applying a current between said conductive substrate formed with said first zinc oxide film, immersed in a solution containing zinc nitrate in the concentration of 0.1 mol/l or more and a carbohydrate, and said electrode immersed in said solution.

20. A process for the production of a zinc oxide thin film according to claim 1, wherein said conductive substrate is heated before the formation of said zinc oxide thin film.

21. A process for production of a zinc oxide thin film according to claim 13, wherein the temperature of said solution for forming said first zinc oxide thin film is equal to the temperature of said solution for forming said second zinc oxide thin film.

22. A process for the production of a zinc oxide thin film according to claim 1, wherein said conductive substrate is a belt-shaped substrate.

23. A process for the production of a zinc oxide thin film according to claim 1, wherein said solution further contains an acid.

24. A process for production of a photoelectric conversion device, comprising a step of applying a current between a conductive substrate immersed in an aqueous solution at least containing nitrate ions, zinc ions, and a carbohydrate, and an electrode immersed in said solution, thereby forming a zinc oxide film on said conductive substrate.

25. A process for the production of a photoelectric conversion device according to claim 24, wherein said carbohydrate comprises a monosaccharide, a disaccharide or a polysaccharide.

26. A process for the production of a photoelectric conversion device according to claim 24, wherein said carbohydrate comprises a mixture of two or more kinds of carbohydrates.

27. A process for the production of a photoelectric conversion device according to claim 24, wherein the concentration of said carbohydrate in said aqueous solution is in a range from 0.001 mol/l to 1.0 mol/l.

28. A process for the production of a photoelectric conversion device according to claim 24, wherein said conductive substrate is one selected from a group consisting of a stainless steel plate, a steel plate, a copper plate, a brass plate, and an aluminum plate.

29. A process for the production of a photoelectric conversion device according to claim 24, wherein said electrode is a zinc electrode.

30. A process for the production of a photoelectric conversion device according to claim 24, wherein the temperature of said aqueous solution is 50° C. or more.

31. A process for the production of a photoelectric conversion device according to claim 24, wherein the current density of said current is in a range from 10 mA/dm$^2$ to 10 A/dm$^2$.

32. A process for the production of a photoelectric conversion device according to claim 24, wherein said conductive substrate comprises a support on which a metal layer is formed.

33. A process for the production of a photoelectric conversion device according to claim 32, wherein said metal film is formed by electroplating.

34. A process for the production of a photoelectric conversion device according to claim 32, further comprising the step of etching said support.

35. A process for the production of a photoelectric conversion device according to claim 32, wherein said support is made of glass, ceramics or resin.

36. A process for the production of a photoelectric conversion device according to claim 24, wherein said zinc oxide thin film comprises at least a first zinc oxide thin film and a second zinc oxide thin film.

37. A process for the production of a photoelectric conversion device according to claim 36, wherein said plurality of zinc oxide thin films are formed under conditions that at least one of the concentration of said aqueous solution, the current density, and the temperature of said solution differs.

38. A process for the production of a photoelectric conversion device according to claim 36, wherein the grain size of said first zinc oxide thin film is smaller than that of said second zinc oxide thin film.

39. A process for the production of a photoelectric conversion device according to claim 36, wherein the grain size of said first zinc oxide thin film is one-tenth or less of that of said second zinc oxide thin film.

40. A process for the production of a photoelectric conversion device according to claim 36, wherein the orientation of said first zinc oxide thin film is such that the C-axes of crystal grains of said film are oriented perpendicularly to said substrate, and the orientation of said second zinc oxide thin film is such that the <101> directions of crystal grains of said film are mainly oriented perpendicularly to said substrate.

41. A process for the production of a photoelectric conversion device according to claim 36, wherein said first zinc oxide film is formed by applying a current between said conductive substrate immersed in an aqueous solution containing zinc nitrate in the concentration of 0.03 mol/l or less and a carbohydrate, and said electrode immersed in said solution.

42. A process for the production of a photoelectric conversion device according to claim 36, wherein said second zinc oxide film is formed by applying a current between said conductive substrate formed with said first zinc oxide film, immersed in a solution containing zinc nitrate in the concentration of 0.1 mol/l or more and a carbohydrate, and said electrode immersed in said solution.

43. A process for the production of a photoelectric conversion device according to claim 24, wherein said conductive substrate is heated before the formation of said zinc oxide thin film.

44. A process for production of a photoelectric conversion device according to claim 36, wherein the temperature of said solution for forming said first zinc oxide thin film is equal to the temperature of said solution for forming said second zinc oxide thin film.

45. A process for the production of a photoelectric conversion device according to claim 24, wherein said conductive substrate is a belt-shaped substrate.

46. A process for the production of a photoelectric conversion device according to claim 24, wherein said solution further contains an acid.

47. A process for the production of a photoelectric conversion device according to claim 24, wherein said semiconductor layer is made of a non-single crystal semiconductor.

48. A process for the production of a semiconductor device substrate, comprising the step of applying a current between a conductive substrate immersed in an aqueous solution at least containing nitrate ions, zinc ions, and a carbohydrate, and an electrode immersed in said solution, thereby forming a zinc oxide film on said conductive substrate.

49. A process for the production of a semiconductor device substrate according to claim 48, wherein said carbohydrate comprises a monosaccharide, a disaccharide or a polysaccharide.

50. A process for the production of a semiconductor device substrate according to claim 48, wherein said carbohydrate comprises a mixture of two or more kinds of carbohydrates.

51. A process for the production of a semiconductor device substrate according to claim 48, wherein the concentration of said carbohydrate in said aqueous solution is in a range from 0.001 mol/l to 1.0 mol/l.

52. A process for the production of a semiconductor device substrate according to claim 48, wherein said conductive substrate is one selected from a group consisting of a stainless steel plate, a steel plate, a copper plate, a brass plate, and an aluminum plate.

53. A process for the production of a semiconductor device substrate according to claim 48, wherein said electrode is a zinc electrode.

54. A process for the production of a semiconductor device substrate according to claim 48, wherein the temperature of said aqueous solution is 50° C. or more.

55. A process for the production of a semiconductor device substrate according to claim 48, wherein the current density of said current is in a range from 10 mA/dm$^2$ to 10 A/dm$^2$.

56. A process for the production of a semiconductor device substrate according to claim 48, wherein said conductive substrate comprises a support on which a metal layer is formed.

57. A process for the production of a semiconductor device substrate according to claim 56, wherein said metal film is formed by electroplating.

58. A process for the production of a semiconductor device substrate according to claim 56, further comprising the step of etching said support.

59. A process for the production of a semiconductor device substrate according to claim 56, wherein said support is made of glass, ceramics or resin.

60. A process for the production of a semiconductor device substrate according to claim 48, wherein said zinc oxide thin film comprises at least a first zinc oxide thin film and a second zinc oxide thin film.

61. A process for the production of a semiconductor device substrate according to claim 60, wherein said plurality of zinc oxide thin films are formed under conditions such at least one of the concentration of said aqueous solution, the current density, and the temperature of said solution differs.

62. A process for the production of a semiconductor device substrate according to claim 60, wherein the grain size of said first zinc oxide thin film is smaller than that of said second zinc oxide thin film.

63. A process for the production of a semiconductor device substrate according to claim 60, wherein the grain size of said first zinc oxide thin film is one-tenth or less of that of said second zinc oxide thin film.

64. A process for the production of a semiconductor device substrate according to claim 60, wherein the orientation of said first zinc oxide thin film is such that the C-axes of crystal grains of said film are oriented perpendicularly to said substrate, and the orientation of said second zinc oxide thin film is such that the <101> directions of crystal grains of said film are mainly oriented perpendicularly to said substrate.

65. A process for the production of a photoelectric conversion device according to claim 60, wherein said first zinc oxide film is formed by applying a current between said conductive substrate immersed in an aqueous solution containing zinc nitrate in the concentration of 0.03 mol/l or less and a carbohydrate, and said electrode immersed in said solution.

66. A process for the production of a semiconductor device substrate according to claim 60, wherein said second zinc oxide film is formed by applying a current between said conductive substrate formed with said first zinc oxide film, immersed in a solution containing zinc nitrate in the concentration of 0.1 mol/l or more and a carbohydrate, and said electrode immersed in said solution.

67. A process for the production of a photoelectric conversion device according to claim 48, wherein said conductive substrate is heated before the formation of said zinc oxide thin film.

68. A process for production of a semiconductor device substrate according to claim 60, wherein the temperature of said solution for forming said first zinc oxide thin film is equal to the temperature of said solution for forming said second zinc oxide thin film.

69. A process for the production of a semiconductor device substrate according to claim 48, wherein said conductive substrate is a belt-shaped substrate.

70. A process for the production of a semiconductor device substrate according to claim 48, wherein said solution further contains an acid.

* * * * *

UNITED STATES PATENT AND TRADEMARK OFFICE
CERTIFICATE OF CORRECTION

PATENT NO. : 5,804,466
DATED : September 8, 1998
INVENTOR(S) : KOZU ARAO ET AL.

Page 1 of 3

It is certified that error appears in the above-identified patent and that said Letters Patent is hereby corrected as shown below:

On the title page;

item [56], "8217443 8/1996 Japan" should read
       --8-217443 8/1996 Japan--.
   item AAF, "Fitzpatrick, Cella Harper & Scinto" should read
       --Fitzpatrick, Cella, Harper & Scinto--.

COLUMN 5

Line 21, "excellent" should read --excellent uniformity and adhesion--.
   Line 66, "substrate 201" should read --substrate 201 by--.

COLUMN 8

Line 25, "be," should read --be--.

COLUMN 12

Line 13, "a n-type" should read --an n-type--.
   Line 22, "9.3" should read --9.3 mA--.

COLUMN 15

Line 67, "test" should read --test.--.

UNITED STATES PATENT AND TRADEMARK OFFICE
CERTIFICATE OF CORRECTION

PATENT NO. : 5,804,466
DATED     : September 8, 1998
INVENTOR(S) : KOZU ARAO ET AL.

It is certified that error appears in the above-identified patent and that said Letters Patent is hereby corrected as shown below:

COLUMN 17

Line 12, "two of" should read --two--.
    Line 66, "surface" should read --surface of--.

COLUMN 19

Line 42, "a" should read --an--.

COLUMN 21

Table 4, "0.33 g/l" should read --0.3 g/l--.
    Table 6, "temperature of hot water tank"
        (1st occurrence) should read --pre-heating in hot water tank--.

COLUMN 22

Table 8 "temperature of hot water tank"
        (1st occurrence) should read --pre-heating in hot water tank--.
    Table 9 "temperature of hot water tank"
        (1st occurrence) should read --pre-heating in hot water tank--.

UNITED STATES PATENT AND TRADEMARK OFFICE
CERTIFICATE OF CORRECTION

PATENT NO. : 5,804,466
DATED     : September 8, 1998
INVENTOR(S) : KOZU ARAO ET AL.

It is certified that error appears in the above-identified patent and that said Letters Patent is hereby corrected as shown below:

COLUMN 23

Table 11 "watertank" should read --water tank--.

Signed and Sealed this

Twenty-fourth Day of August, 1999

Attest:

Q. TODD DICKINSON

*Attesting Officer*    *Acting Commissioner of Patents and Trademarks*